(12) United States Patent
Yu et al.

(10) Patent No.: US 11,264,301 B2
(45) Date of Patent: Mar. 1, 2022

(54) SYSTEM AND METHOD TO ENHANCE RELIABILITY IN CONNECTION WITH ARRANGEMENTS INCLUDING CIRCUITS

(71) Applicant: Western Digital Technologies, Inc., San Jose, CA (US)

(72) Inventors: Lee Kong Yu, Penang (MY); Sungjun Im, San Jose, CA (US); Chun Sean Lau, Penang (MY); Yoong Tatt Chin, Penang (MY); Paramjeet Singh Gill, Kuala Lumpur (MY); Weng-Hong Teh, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 66 days.

(21) Appl. No.: 16/821,926

(22) Filed: Mar. 17, 2020

(65) Prior Publication Data

US 2020/0219787 A1 Jul. 9, 2020

Related U.S. Application Data

(63) Continuation of application No. 15/715,863, filed on Sep. 26, 2017, now Pat. No. 10,636,722.

(51) Int. Cl.
*H01L 23/367* (2006.01)
*H01L 23/31* (2006.01)
(Continued)

(52) U.S. Cl.
CPC ...... *H01L 23/3675* (2013.01); *H01L 21/4871* (2013.01); *H01L 21/56* (2013.01); *H01L 22/20* (2013.01); *H01L 23/3121* (2013.01); *H01L 23/3171* (2013.01); *H01L 23/3185* (2013.01); *H01L 23/3736* (2013.01); *H01L 23/562* (2013.01); *H01L 24/13* (2013.01); *H01L 24/16* (2013.01); *H01L 24/81* (2013.01); *H01L 2224/05* (2013.01);
(Continued)

(58) Field of Classification Search
None
See application file for complete search history.

(56) References Cited

U.S. PATENT DOCUMENTS 7,880,295 B2 2/2011 Kikuchi
10,236,229 B2 3/2019 Gandhi
(Continued)

OTHER PUBLICATIONS

Che et al., "Lead Free Solder Joint Reliability Characterization for PBGA, PQFP and TSSOP Assemblies," IEEE 2005 Electronic Components and Technology Conferences, pp. 916-921.
(Continued)

*Primary Examiner* — Long Pham
(74) *Attorney, Agent, or Firm* — Morgan, Lewis & Bockius LLP

(57) ABSTRACT

A reliability cover that is disposed over at least one of an integrated circuit package and a Si die of the integrated circuit package is disclosed. The integrated circuit package is mountable to a printed circuit board via a plurality of solder balls. The reliability cover is configured to reduce a difference in a coefficient of thermal expansion between the
(Continued)

integrated circuit package and the printed circuit board, and between the Si die and a substrate of the integrated circuit package by a threshold value.

17 Claims, 18 Drawing Sheets

(51) Int. Cl.
*H01L 23/373* (2006.01)
*H01L 21/66* (2006.01)
*H01L 21/56* (2006.01)
*H01L 21/48* (2006.01)
*H01L 23/00* (2006.01)

(52) U.S. Cl.
CPC ............... *H01L 2224/05166* (2013.01); *H01L 2224/05181* (2013.01); *H01L 2224/13101* (2013.01); *H01L 2224/16225* (2013.01); *H01L 2224/16227* (2013.01); *H01L 2224/81385* (2013.01); *H01L 2224/81395* (2013.01); *H01L 2224/81815* (2013.01); *H01L 2224/81908* (2013.01); *H01L 2924/10253* (2013.01); *H01L 2924/14* (2013.01); *H01L 2924/16151* (2013.01); *H01L 2924/16195* (2013.01); *H01L 2924/16235* (2013.01); *H01L 2924/3512* (2013.01)

(56) References Cited

U.S. PATENT DOCUMENTS

| 10,269,669 | B2* | 4/2019 | Han | H01L 21/4817 |
| 2004/0188496 | A1 | 9/2004 | Liu | |
| 2006/0060963 | A1* | 3/2006 | Chang | H01L 25/0652 |
| | | | | 257/706 |
| 2007/0026568 | A1 | 2/2007 | Beyne | |
| 2008/0173698 | A1 | 7/2008 | Marczi | |
| 2014/0091461 | A1* | 4/2014 | Shen | H01L 21/563 |
| | | | | 257/738 |
| 2015/0115467 | A1* | 4/2015 | Park | H01L 23/49827 |
| | | | | 257/774 |
| 2015/0300905 | A1 | 10/2015 | Kalandar | |
| 2018/0128769 | A1 | 5/2018 | Fujiwara | |
| 2018/0158772 | A1 | 6/2018 | Tanaka | |

OTHER PUBLICATIONS

Che et al., "Thermal Fatigue Reliability Analysis for PBGA with SN-3.8Ag-0.7Cu Solder Joints," 2004 Electronics Packaging Technology Conference, pp. 787-792.

Moideen et al., "Solder Joint Reliability Enhancement through Surface Mounting Solder Joint Reflow Optimization in Enterprise Grade Solid State Drives SSDs," 37th International Electronic Manufacturing Technology Conference, IEEE, 2016, 4 pages.

* cited by examiner

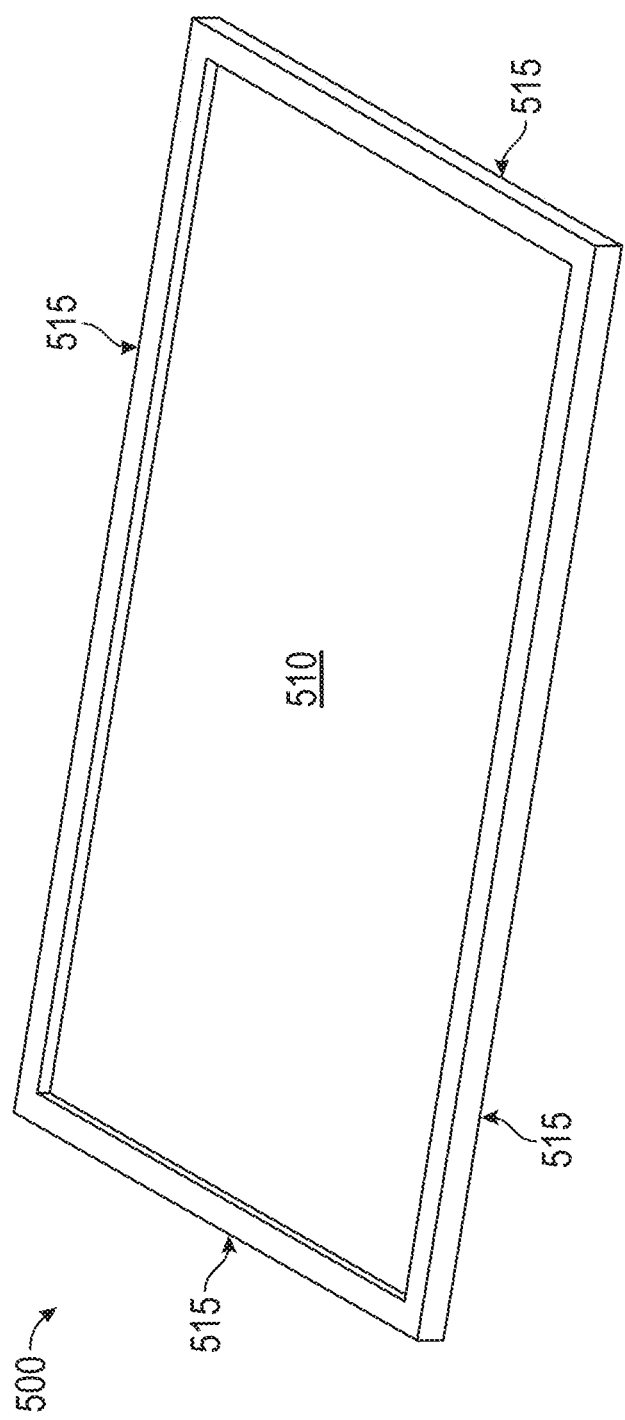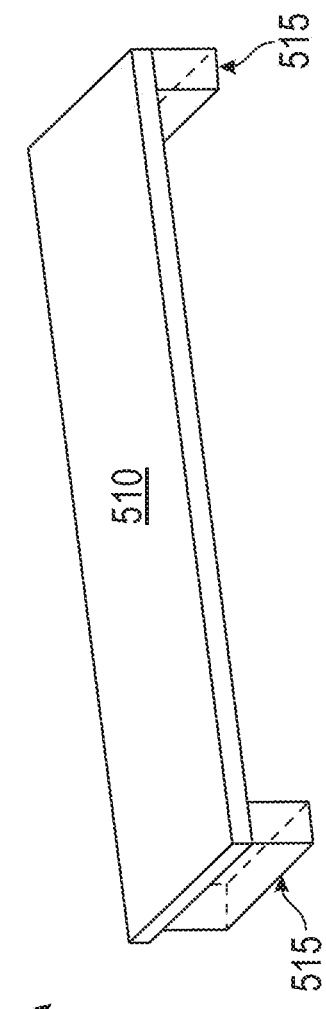

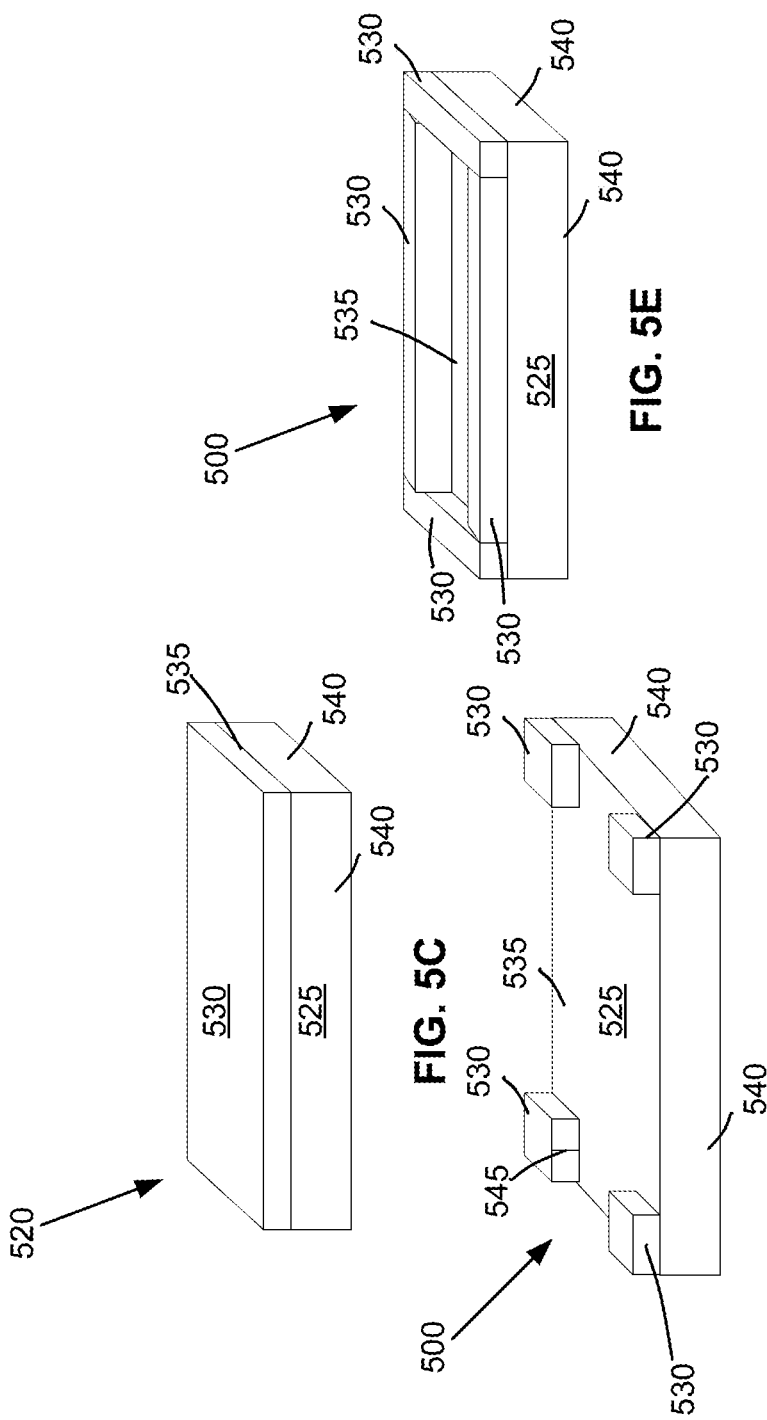

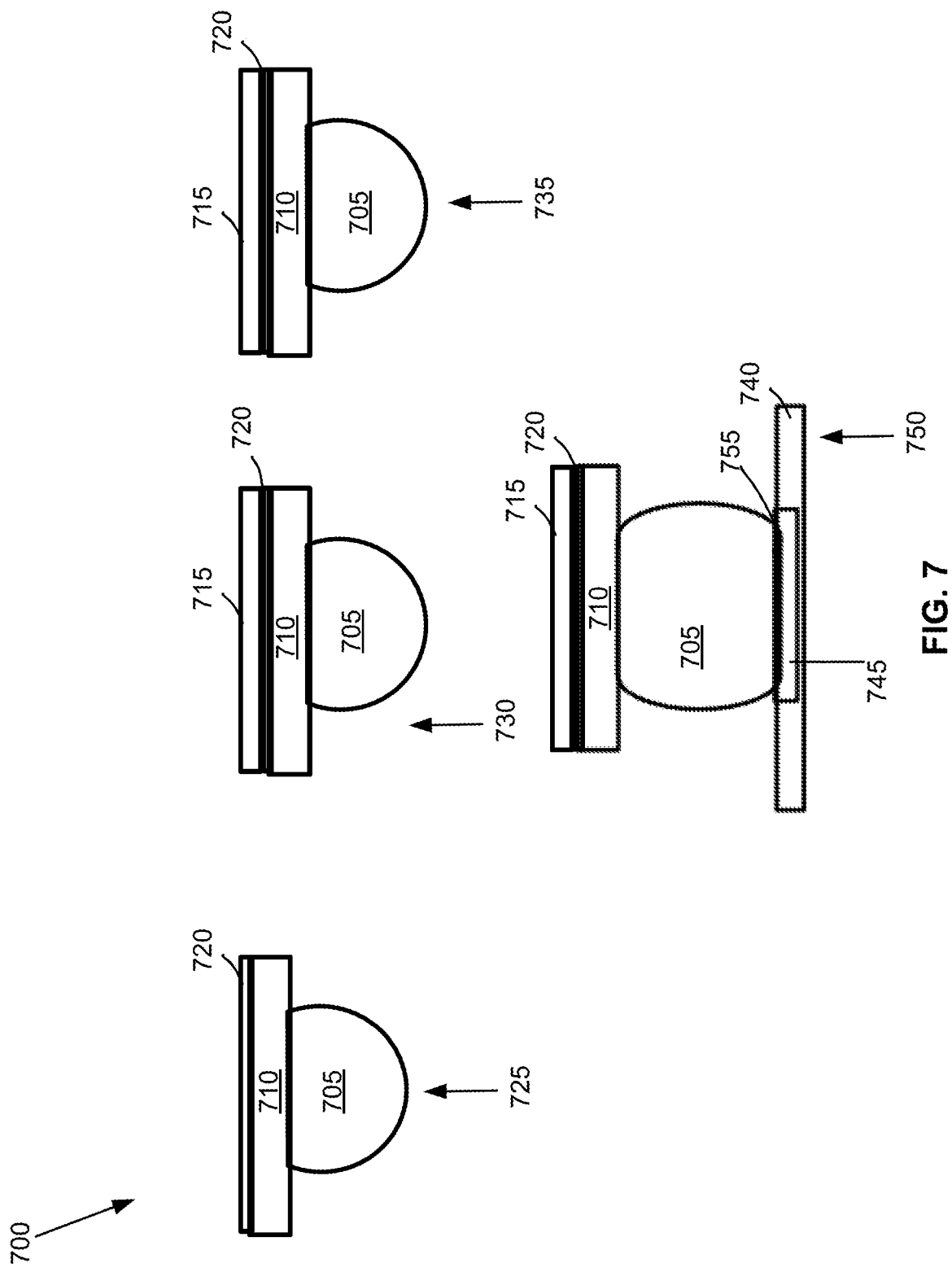

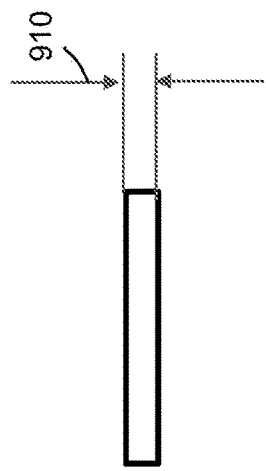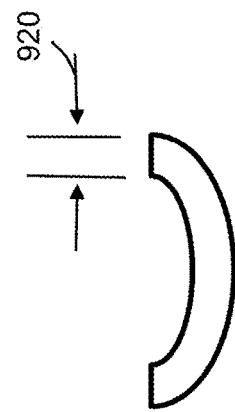
FIG. 9A    FIG. 9B
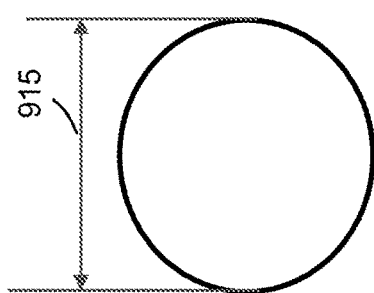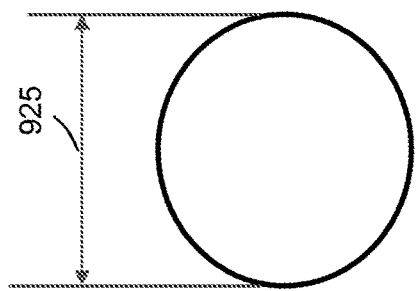

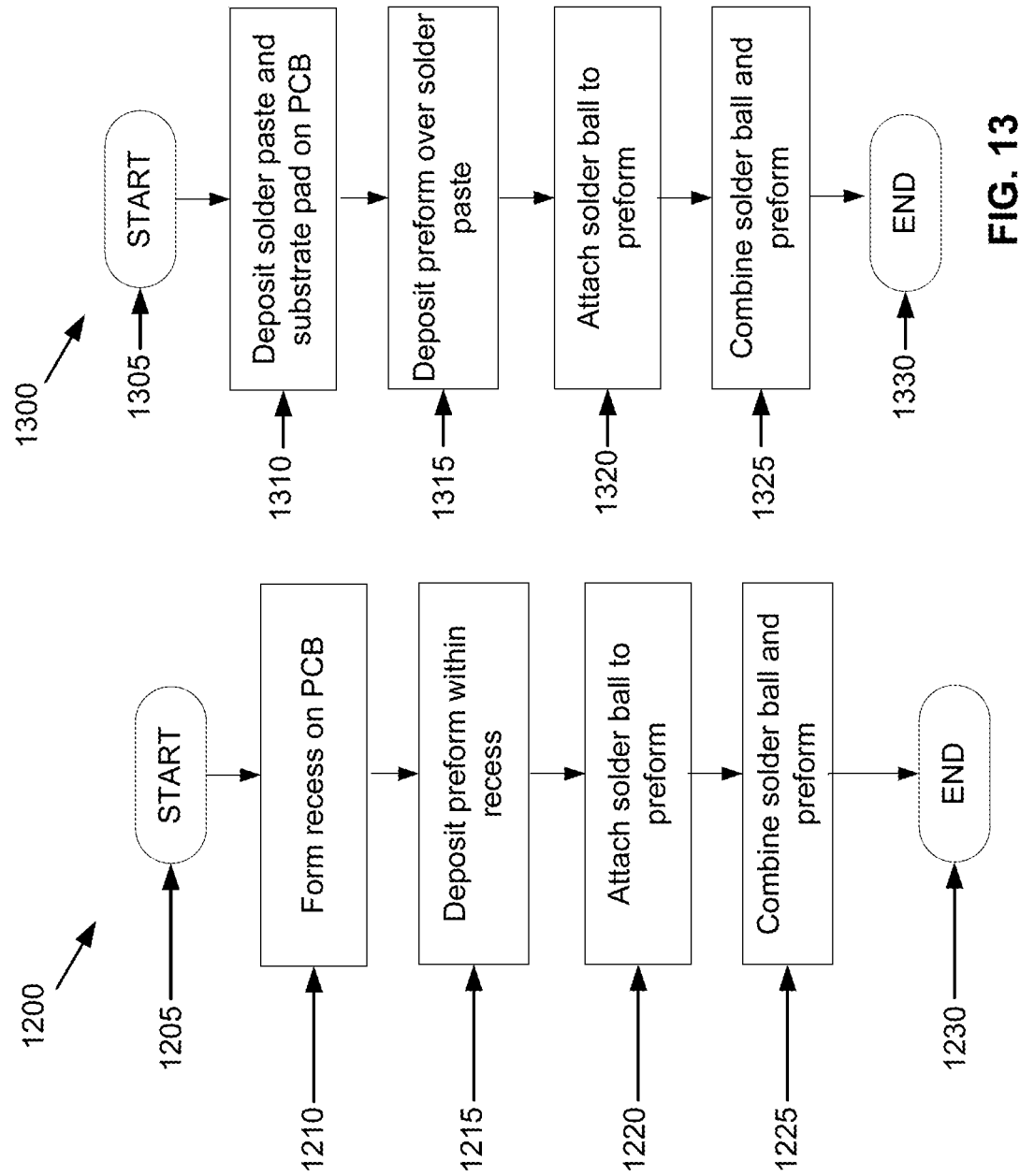

SYSTEM AND METHOD TO ENHANCE RELIABILITY IN CONNECTION WITH ARRANGEMENTS INCLUDING CIRCUITS

CROSS-REFERENCE TO RELATED APPLICATION

This application is a continuation of U.S. application Ser. No. 15/715,863, filed on Sep. 26, 2017, now U.S. Pat. No. 10,636,722, the entirety of which is incorporated herein by reference for all purposes.

BACKGROUND

The following description is provided to assist the understanding of the reader. None of the information provided or references cited is admitted to be prior art.

A ball grid array assembly is used to mount an integrated circuit package such as a memory die package, which has been encapsulated in a molding material, to a printed circuit board. The ball grid array assembly includes a plurality of solder balls arranged in a grid-like pattern between the integrated circuit package and the printed circuit board. The ball grid array assembly is heated in a reflow oven or using another mechanism to permanently attach the plurality of solder balls to the integrated circuit package and to the printed circuit board. The connection point of each of the plurality of solder balls with the integrated circuit package and with the printed circuit board forms a solder joint. These solder joints provide mechanical support to and electrical interconnection between the integrated circuit package and the printed circuit board. However, these solder joints are prone to failing (e.g., cracking) under various stress conditions.

SUMMARY

In accordance with some aspects of the present disclosure, a system is disclosed. The system includes a reliability cover disposed over at least one of an integrated circuit package and a Si die of the integrated circuit package. The integrated circuit package is mountable to a printed circuit board via a plurality of solder balls, and the reliability cover is configured to reduce a difference in a coefficient of thermal expansion between the integrated circuit package and the printed circuit board, and between the Si die and a substrate of the integrated circuit package by a threshold value.

In accordance with some other aspects of the present disclosure, a method is disclosed. The method includes identifying a failure profile of solder joints formed between a first component and a plurality of solder balls and between the plurality of solder balls and a second component. The method further includes disposing a reliability cover over one or more surfaces of the first component and the second component based upon the failure profile.

In accordance with yet other aspects of the present disclosure, a system is disclosed. The system includes a printed circuit board having a first coefficient of thermal expansion, an integrated circuit package configured to be mounted to the printed circuit board and having a second coefficient of thermal expansion, and a reliability cover disposed over at least a portion of the integrated circuit package and at least a portion of a Si die within the integrated circuit package. The IC package-level reliability cover is configured to reduce a difference between the first coefficient of thermal expansion and the second coefficient of thermal expansion by a threshold value. The die-level reliability cover is configured to reduce a difference between the Si coefficient of thermal expansion and the IC substrate coefficient of thermal expansion by a threshold value.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIGS. 5A and 5B are perspective views of the reliability covers, in accordance with some other embodiments of the present disclosure.

FIGS. 5C-5E are perspective views of the device package having the reliability cover disposed thereon, in accordance with some other embodiments of the present disclosure.

FIG. 7 is an example flow diagram showing a process for disposing the reliability cover over the integrated circuit package, in accordance with some embodiments of the present disclosure.

FIGS. 9A and 9B are example preforms used for attaching the solder balls to the printed circuit board, in accordance with some embodiments of the present disclosure.

FIG. 12 is an example flowchart outlining operations for attaching the solder balls to the printed circuit board, in accordance with some embodiments of the present disclosure.

FIG. 13 is another example flowchart outlining operations for attaching the solder balls to the printed circuit board, in accordance with some other embodiments of the present disclosure.

Figure 1:
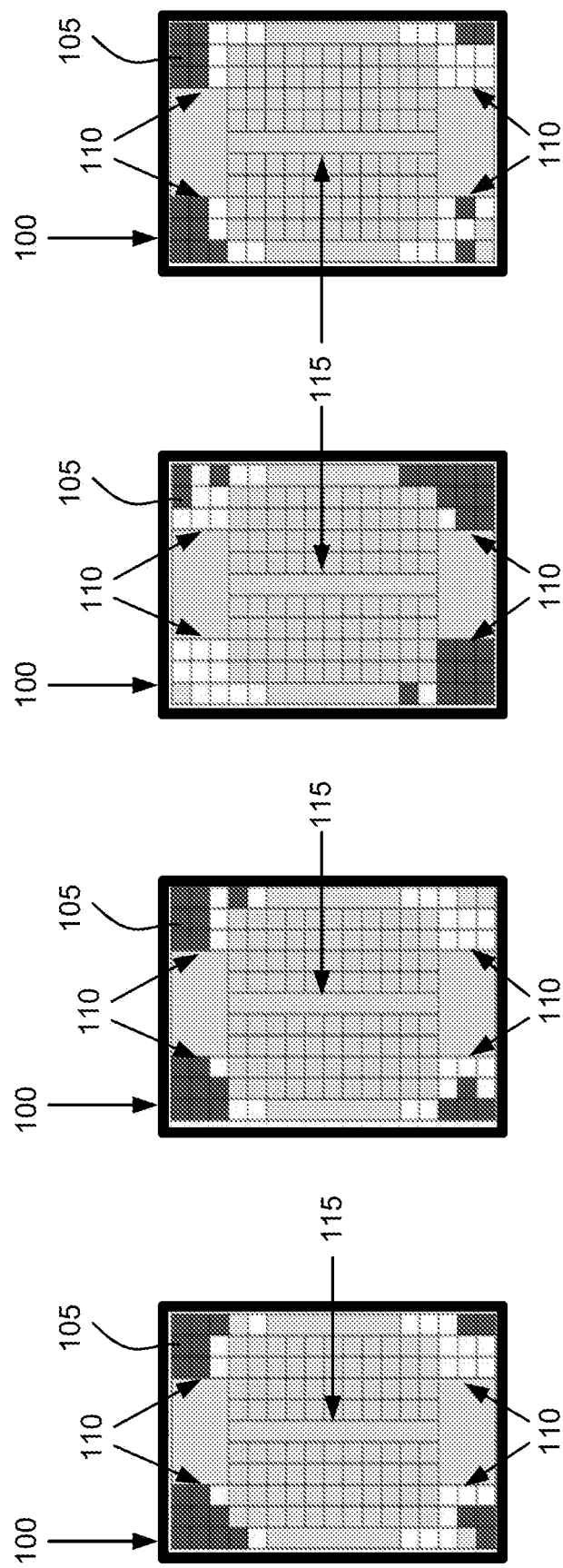
FIG. 1 is an example illustrating solder joint failures in an integrated circuit package, in accordance with some embodiments of the present disclosure.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

The present disclosure is directed to systems and methods that improve the reliability and durability of solder joints formed between two components. For example, solder joints may be formed by a plurality of solder balls between an integrated circuit package and a printed circuit board ("PCB"), between a substrate of the integrated circuit package and a Silicon die ("Si die"), between two Si dies, etc. The integrated circuit package including one or more of the Si dies and mounted to the PCB via the plurality of solder balls is typically subjected to one or more reliability tests before being shipped out to consumers. These reliability tests simulate field use conditions and particularly test the reliability of the solder joints. "Reliability" as used herein means the ability of the solder joints to withstand various stresses without failing (e.g., breaking, cracking, or otherwise substantially impacting the integrity of the solder joints). The reliability tests, therefore, apply various kinds of stresses to the solder joints to identify areas of weaknesses in the solder joints where those solder joints may start failing and making the solder joint less reliable. The reliability tests may be performed using finite element analysis or other predictive modeling techniques.

One such reliability test is the temperature cycling test ("TCT"). The TCT is an environmental stress test that evaluates the reliability of solder joints in a ball grid array packaging by inducing failure in the solder joints through thermal fatigue. To perform the TCT, each solder joint is subject to a plurality of temperature cycles at extreme temperatures. For example, each solder joint may be subject to up to one thousand (1000) cycles of temperature cycling, with each cycle going between zero and one hundred degree Celsius (0-100° C.) or between a negative forty and eighty degree Celsius (−40-80° C.) The repeated cycling at the extreme temperatures causes the PCB, the integrated circuit package, the Si dies, and the plurality of solder balls to repeatedly expand and/or contract.

Due to the repeated expansion and contraction induced by temperature cycling, shear stresses at the solder joints increase and cause the solder joints to fail. The shear stresses at the solder joints are primarily driven by a difference in a coefficient of thermal expansion ("CTE") of the integrated circuit package, the PCB, and the Si die. The CTE measures a change in size per degree change of temperature at a constant or substantially constant pressure. A difference in the CTE of the components (e.g., PCB and integrated circuit package, Si die and integrated circuit package, etc.) that form the solder joint influences the solder joint reliability. Generally speaking, higher the CTE difference, lower is the reliability of the solder joints and greater is the chance of the solder joint failing.

The PCB, which is generally composed of a composite material (woven glass fabric, plastic (resin), and copper), has a higher effective CTE compared to the CTE of the integrated circuit package, generally composed of stacks of Si die and mold compound. For example, the PCB typically has a CTE of about fourteen to twenty-one parts per million per degree Celsius ("14-21 ppm/° C."). The CTE of the integrated circuit package is largely driven by the form size of the integrated circuit package, number of Si dies within the integrated circuit package, the CTE of the Si die and the CTE of the molding compound used to encapsulate the integrated circuit package, and the CTE of the integrated circuit package substrate. Thus, the integrated circuit package has an effective CTE, which is a combination of the CTEs of the integrated circuit package molding compound and the integrated circuit package substrate, as well as the CTE of the Si dies. The effective CTE of the integrated circuit package may, in some embodiments, be about six or seven parts per million per degree Celsius (6-7 ppm/° C.), which is much lower than the CTE of the PCB. Thus, the PCB and the integrated circuit package have varying CTEs.

The difference between the effective CTE of the integrated circuit package and the CTE of the PCB causes the PCB and the integrated circuit package to expand and contract at varying rates. For example, due to the CTE of the PCB being higher than the effective CTE of the integrated circuit package, the PCB expands and contracts more during TCT compared to the integrated circuit package. In some embodiments, the difference in the expansion and contraction between the PCB and the integrated circuit package may be about two and two tenths parts per million per degree Celsius (about 2.2 ppm/° C.).

Similarly, the CTE between the integrated circuit package substrate and the Si die therein may vary. The CTE of a particular Si die depends upon the density of metal within the Si die, the amount of Si within the Si die, and the size of the Si die. Thus, the CTE of one Si die may be different from the CTE of another Si die. Generally speaking, higher the amount of Si within a Si die, lower is the CTE of that Si die. Thus, based upon the CTE of a particular Si die and the CTE of the integrated circuit package substrate, a CTE difference may exist between a Si die and the integrated circuit package substrate, as well as between two Si dies.

Further, the sizes of the integrated circuit package are shrinking and a number of the Si dies within the integrated circuit package are increasing. Reducing size and increasing number of Si dies further reduces the effective CTE of the integrated circuit package, thereby exacerbating the difference in CTE between the PCB and the integrated circuit package. Thus, as form sizes reduce and number of components in each integrated circuit package increase, the reliability of the solder joint further reduces. The inventors have found that while performing the TCT, the solder joints that are at or close to the corners or edges of a component are more prone to failing (e.g., fail first) than the solder joints that are towards the center of that component.

FIG. 1 shows examples of solder joint failures due to CTE difference between the integrated circuit package and the PCB after performing TCT. Specifically, FIG. 1 shows solder joint crack severity results of a plurality of ball grid arrays 100 after performing TCT at temperatures between zero and hundred degree Celsius (0-100° C.) for about seven hundred and fifty (~750) cycles. For ease of explanation, the integrated circuit package and the PCB are not shown in FIG. 1. In each of the plurality of ball grid arrays 100, each square 105 is representative of one solder joint. For example, the square 105 is representative of a solder ball that forms the solder joint between the integrated circuit package and the PCB.

The inventors have found that the solder joints at corners 110 of each of the ball grid arrays 100 fail before the solder joints towards the center of the ball grid arrays. Thus, the solder joints at the corners 110 are less reliable than the solder joints at the center. It is to be understood that the plurality of ball grid arrays 100 are only an example. In other embodiments, the shape, size, and failure pattern of the solder joints on each of the plurality of ball grid arrays 100 may vary.

Figure 2:
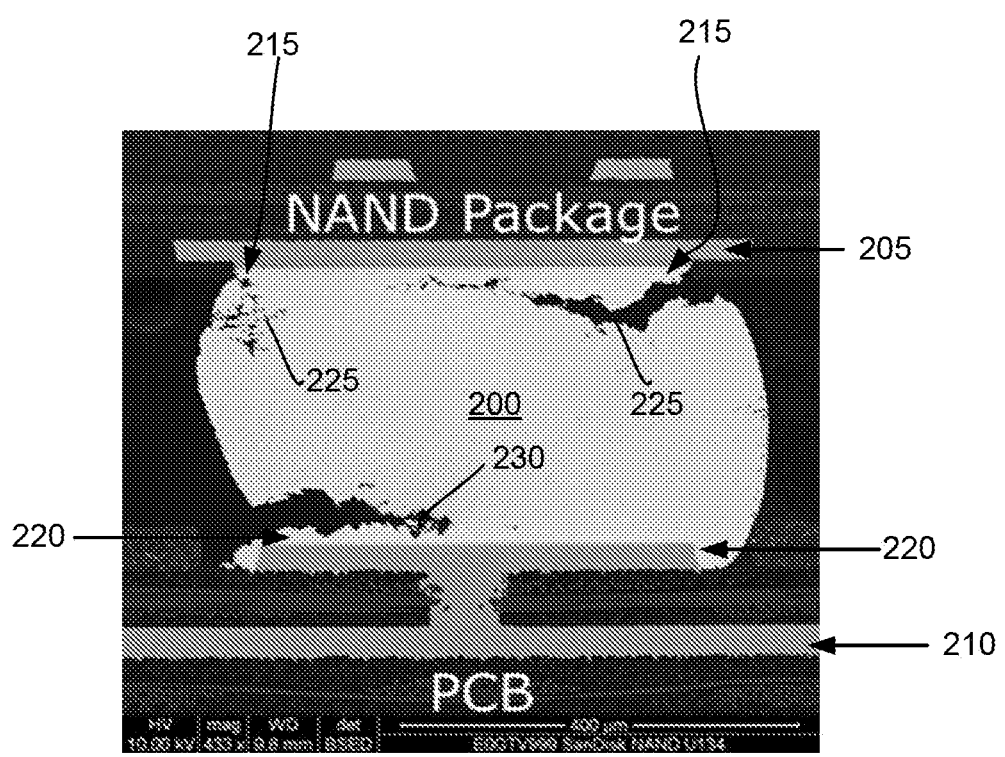
FIG. 2 is a cross sectional view illustrating the solder joint failures in one solder ball, in accordance with some embodiments of the present disclosure.

Failure of one solder joint is shown in greater detail in FIG. 2. Specifically, FIG. 2 is a cross sectional view that shows a solder ball 200 after performing TCT. The solder ball 200 is attached to an integrated circuit package 205 and a PCB 210. The solder ball 200 forms a solder joint 215 with the integrated circuit package 205 and a solder joint 220 with the PCB 210. When the solder ball 200 is subjected to TCT under similar conditions as mentioned above in FIG. 1, the solder joints 215 and 220 start failing, as illustrated by cracks 225 and 230. The profile (e.g., size, shape, direction of propagation, etc.) of the crack 225 may vary from the profile of the crack 230. However, both of the cracks 225 and 230 reduce the reliability of the solder joints 215 and 220 and therefore, of the integrated circuit package 205 and the PCB 210.

The cracks 225 and 230 are at least in part due to the difference in CTE between the integrated circuit package 205 and the PCB 210. The present disclosure provides a system and method that reduces the CTE mismatch (e.g., the difference in the CTE) between the integrated circuit package 205 and the PCB 210. By reducing the difference in the CTE between the integrated circuit package 205 and the PCB 210, the integrated circuit package and the PCB may be made to expand and contract at similar rates when subject to TCT cycling, thereby reducing or at least somewhat equalizing the shear stresses at the solder joints 215 and 220. By reducing or at least somewhat equalizing the shear stresses, the failures at the solder joints 215 and 220 may be prevented or at least reduced. For example, after reducing the CTE mismatch between the integrated circuit package 205 and the PCB 210, the solder joints 215 and 220 may be able to withstand higher (or lower) temperature extremes for longer periods of time.

As will be discussed below, in some embodiments, interconnects other than the solder balls may be used for connecting two components and for forming the solder joints. For example, wires, copper pillars, through-silicon vias, microbumps, etc. may be used to connect one Si die to another Si die. Solder balls or other types of interconnects may be used between the integrated circuit package substrate and a Si die. The solder joints formed by these interconnects may also be subject to similar reliability tests as those mentioned above, and further subject to failing due at least in part to the CTE difference between the components forming the solder joints.

In at least some embodiments, the CTE mismatch may be reduced by using a reliability cover that is attached, deposited, or otherwise disposed over at least a portion of the integrated circuit package 205, as discussed below. In some embodiments and as discussed below, the reliability cover may additionally or alternatively be disposed on the Si dies within the integrated circuit package. The reliability cover is a high CTE material that increases the effective CTE of the integrated circuit package 205 and therefore reduces the CTE difference between the integrated circuit package and the PCB 210. Alternatively, or in addition to providing the reliability cover, in some embodiments, the flexibility and robustness of the solder joint itself may be increased. The flexibility and robustness of the solder joint may be increased by increasing a volume of the solder ball 200, as also discussed below.

The reliability of the solder joints is also impacted due to temperature induced dynamic warpage of the components forming the solder joints. For example, as the integrated circuit package and/or the Si dies are becoming thinner, those components are becoming more and more prone to warping and the solder joints formed by those components are becoming less and less reliable. Warping is more prominent at the corners of those components as well. The reliability cover increases the robustness of the components at the solder joints, thereby also increasing the ability to withstand warping.

Figure 3:
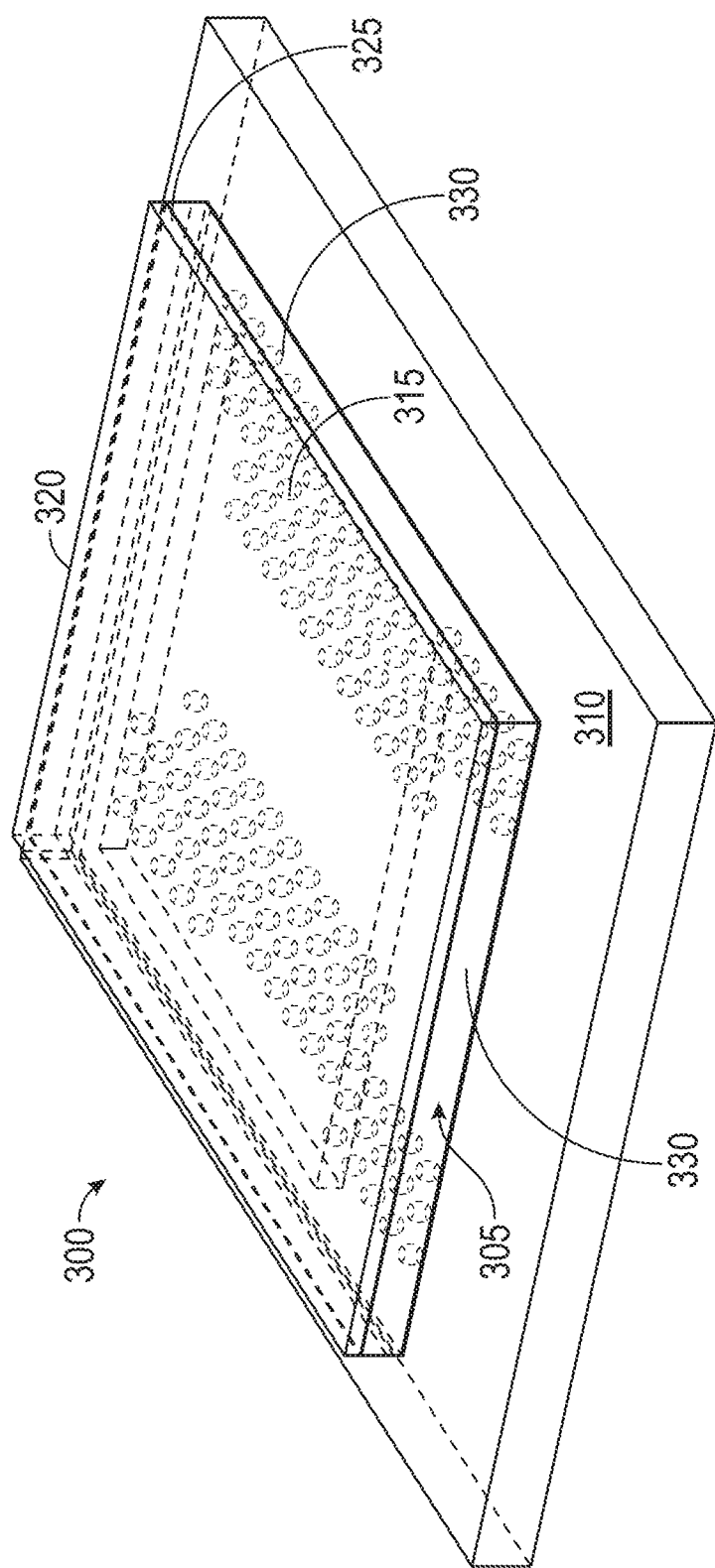
FIG. 3 is a perspective view of the integrated circuit package mounted to a printed circuit board, and a reliability cover disposed over the integrated circuit package, in accordance with some embodiments of the present disclosure.

Turning now to FIG. 3, an example of a device package 300 is shown, in accordance with some embodiments of the present disclosure. The device package 300 includes an integrated circuit package 305 surface mounted to a PCB 310 via a plurality of solder balls 315 arranged in a ball grid pattern. A reliability cover 320 is disposed over the integrated circuit package 305. The integrated circuit package 305 and the reliability cover 320 are shown transparent or partially transparent simply for ease of explanation.

The integrated circuit package 305 may be any of a variety of semiconductor packages that are mountable to the PCB 310 using surface mount technology. The integrated circuit package 305 includes one or more Si dies encapsulated by a molding material. The integrated circuit package 305 may be any of a variety of semiconductor packages such as a memory package, a microelectromechanical systems package, microprocessor package, etc. that are connected to the PCB 310 using ball grid arrays. The integrated circuit package 305 may be formed by encapsulating the one or more Si dies, as well as a portion of bonding wires that facilitate the connection of the one or more Si dies to the PCB 310, within the molding material. The molding material protects the one or more Si dies and bonding wires from physical damage and corrosion.

The PCB 310 may be any of a variety of PCBs that are commonly used with the type of the integrated circuit package 305 to mechanically support and electrically connect the various components of the integrated circuit package 305. In some embodiments, the PCB 310 may be single sided, double sided, foldable (bi-fold, tri-fold, etc.) and/or have multiple layers laminated together. Further, the shape, size, and configuration of the integrated circuit package 305 and the PCB 310 may vary from one embodiment to another. Although the integrated circuit package 305 has been shown as being smaller than the PCB 310, in other embodiments, the integrated circuit package and the PCB may have varying sizes and shapes. Moreover, the integrated circuit package 305 may have an integrated package effective CTE value and the PCB 310 may have a PCB effective CTE value. As discussed above, the PCB effective CTE value is generally higher than the integrated package effective CTE value.

The plurality of solder balls 315 may be any of a variety of solder balls that are used in surface mount technology and ball grid arrays. Each of the plurality of solder balls 315 may be arranged in a particular pattern (e.g., a grid pattern) between the integrated circuit package 305 and the PCB 310. Further, the plurality of solder balls 315 may be composed of a solder ball material and may be attached to the integrated circuit package 305 and/or the PCB 310 via solder paste and surface, substrate, or contact pads (not shown). The shape, size, and number of the plurality of solder balls 315 forming the ball grid arrays may vary from one embodiment to another. In some embodiments, interconnects other than the plurality of solder balls 315 may be used to form the solder joints between the integrated circuit package 305 and the PCB 310, and the present disclosure may be applicable to such interconnects as well.

The reliability cover 320 is composed of a high CTE material and is disposed over the integrated circuit package 305. Particularly, the reliability cover 320 is disposed over the molding material of the integrated circuit package 305. In some embodiments and as shown in FIG. 3, the reliability cover 320 may be disposed on a top surface 325 of the integrated circuit package 305. In other embodiments, the reliability cover 320 may additionally or alternatively be disposed on a side surface 330 of the integrated circuit package 305. In yet other embodiments, the reliability cover 320 may additionally or alternatively be disposed on other surfaces of the integrated circuit package 305 as desired or needed. Further and as shown in the device package 300, the reliability cover 320 may be disposed on an entire surface (e.g., the entirety of the top surface 325) of the integrated circuit package 305. In other embodiments, the reliability cover 320 may be disposed on only certain portions of the integrated circuit package 305. Example embodiments of the reliability cover 320 are described below.

Figure 4A:
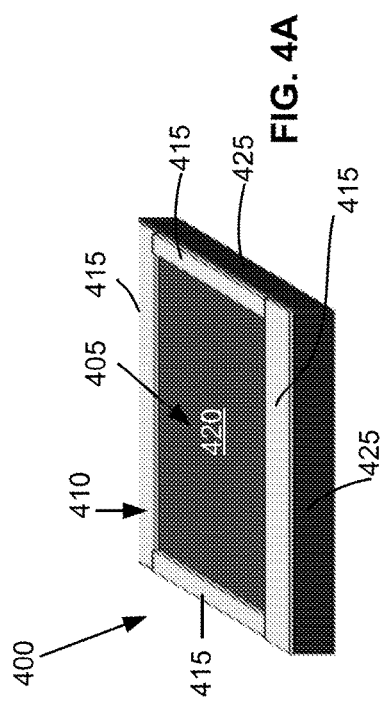
FIGS. 4A-4C are perspective, top, and side views respectively, of a device package having the reliability cover disposed thereon, in accordance with some embodiments of the present disclosure.
Figure 4C:
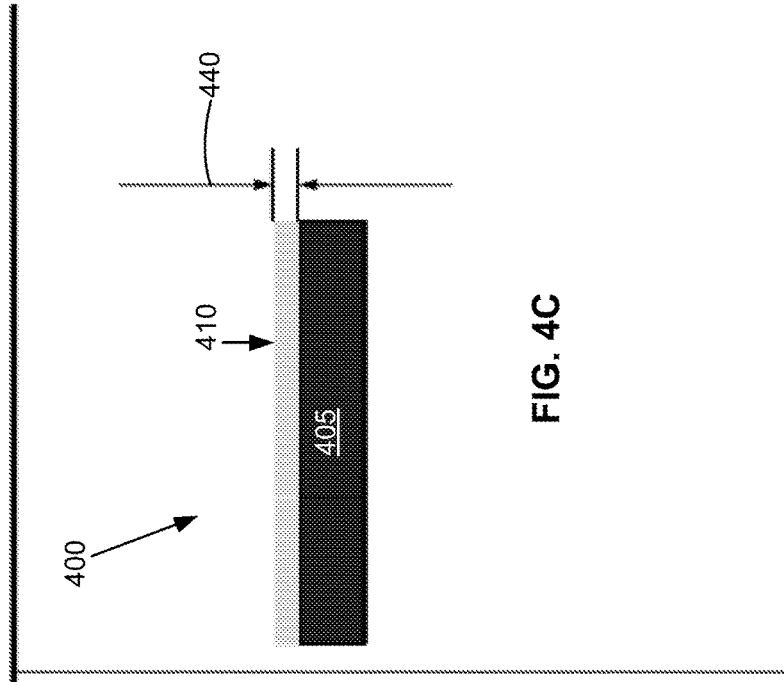
Figure 4B:
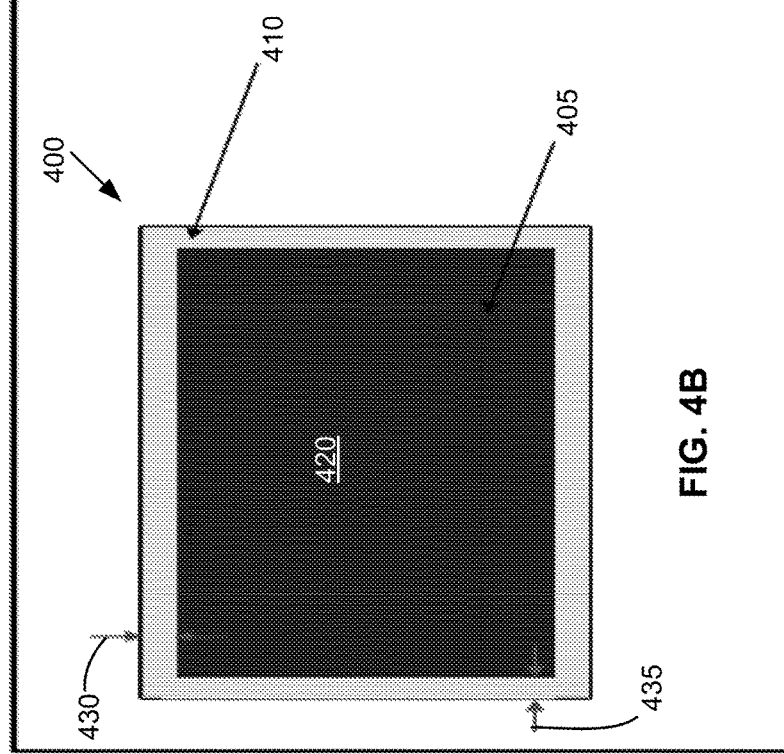

Turning to FIGS. 4A-4C, portions of a device package 400 are shown, in accordance with some embodiments of the present disclosure. The device package 400 shows an integrated circuit package 405 over which a reliability cover 410 has been disposed. The PCB and the solder balls that connect the integrated circuit package 405 to the PCB are not shown in FIGS. 4A-4C. FIG. 4A is a perspective view of the device package 400, FIG. 4B is a top view and FIG. 4C is a side of the device package.

The reliability cover 410 is deposited in the form of a thin film over the integrated circuit package 405. In some embodiments, the reliability cover 410 may be deposited as a film by sputtering techniques. In other embodiments, other techniques may be used to deposit the reliability cover 410 as a film. Further, as shown in FIG. 4A, the reliability cover 410 may be deposited in multiple film portions 415 or as shown in FIG. 4B, as a continuous one piece film. Additionally and as mentioned above, the portions of the integrated circuit package 405 over which the reliability cover 410 is deposited may vary from one embodiment to another. Generally speaking, the portions of the integrated circuit package 405 over which the reliability cover 410 is provided correspond to a failure profile of the solder joints.

The failure profile of the solder joints may identify those solder joints that are prone to failing first. For example, as discussed above, the solder joints at the corners are more prone to failing than the solder joints towards the center. The failure profile may identify the solder joints that are prone to failing before other solder joints. The failure profile may also provide localized CTE mismatch values at various locations on the integrated circuit package 405. As noted above, the CTE of the integrated circuit package 405 is a combination of the CTE of the molding compound, the CTE of the Si dies, and the CTE of the integrated circuit package substrate. Depending upon the arrangement of the Si dies within the integrated circuit package 405 and the volume of the molding material and the integrated circuit package substrate in a particular region of the integrated circuit package, the integrated package effective CTE at various locations of the integrated circuit package may vary. The integrated package effective CTE of each region of the integrated circuit package 405 may be used to compute a localized CTE mismatch value with the CTE of the PCB. The failure profile of the solder joints may include such localized CTE mismatch values as well. Higher localized CTE mismatch values may indicate that solder joints in those regions may be more prone to failing than those solder joints where the localized CTE mismatch value is lower.

Thus, based upon the failure profile of the solder joints, the reliability cover 410 may be disposed on the integrated circuit package 405. For example and as discussed in FIG. 1 above, the solder joints are more prone to fail at the corners and edges. Therefore, as shown in FIGS. 4A and 4B, the reliability cover 410 may be provided on the corners and edges of a top surface 420 of the integrated circuit package 405 that correspond to or are substantially aligned with a vertical axis passing through those solder joints that are more prone to failing.

In other embodiments, the reliability cover 410 may be provided on other surfaces of the integrated circuit package 405 based upon the failure profile of the solder joints. For example, in some embodiments, the reliability cover 410 may additionally or alternatively extend to side surfaces 425 of the integrated circuit package 405. In other embodiments, the reliability cover 410 may be provided on additional or different areas of the top surface 420, or even on surfaces other than the top and side surfaces. In yet other embodiments, the reliability cover 410 may cover the top surface 420, the side surfaces 425, and/or other surfaces of the integrated circuit package 405 in their entirety. Thus, the reliability cover 410 may be provided on any surface of the integrated circuit package 405 where the reliability cover is needed or desired to minimize the CTE difference between the integrated circuit package 405 and the PCB. In some embodiments, a patchwork of the reliability cover 410 across the various surfaces of the integrated circuit package 405 may also be used.

Since the reliability cover 410 is a high CTE material, by providing the reliability cover on the integrated circuit package 405, the integrated package effective CTE in the areas where the reliability cover is disposed may be increased. By increasing the integrated package effective CTE in a particular area, the CTE difference between the integrated circuit package 405 and the PCB in that particular area may be reduced. Again, by reducing the CTE difference, solder joint failure may be avoided or at least minimized.

The shape and size of the reliability cover 410 may also vary in some embodiments. Although the reliability cover 410 has been shown in FIGS. 4A-4C as being deposited in a rectangular or substantially rectangular profile, in other embodiments, the reliability cover may deposited in other geometric and possibly non-geometric shapes. The shape in which the reliability cover 410 is deposited is based on the failure profile of the solder joints. Also, the reliability cover 410 may be deposited in varying widths. For example, as shown in FIG. 4B, widths 430 and 435 of the reliability cover 410 are substantially uniform at about half a millimeter. In other embodiments, the widths of the reliability cover 410 may vary. Likewise, a thickness 440 of the film of the reliability cover 410 may vary from one embodiment to another. For example, in some embodiments, the thickness 440 of the reliability cover 410 may be within a range of about fifty to hundred nanometers to tens of micrometers. In other embodiments, other thicknesses may be used.

The material of the reliability cover 410 may also vary based upon the CTE difference that is desired to be reduced. For example, the reliability cover 410 when deposited as a film may be composed of tantalum nitride (TaN), Tantalum, Titanium, Titanium nitride (TiN), Ta/Cu, Ti/Cu, TaN/Cu, TiN/Cu, Ni/Au, and aluminum nitride (AlN). In other embodiments, other high CTE materials or alloys may be used. Generally speaking, based upon the CTE difference between the integrated circuit package 405 and the PCB that is desired to be reduced, a material having a high enough CTE that may reduce that CTE difference may be selected for the reliability cover 410.

Although the reliability cover 410 has been described in FIGS. 4A-4C as being disposed over the integrated circuit package 405, in some embodiments and as discussed below, the reliability cover may additionally or alternatively be disposed on one or more Si dies within the integrated circuit package for reducing the CTE mismatch value, as well as to increase the mechanical robustness of the integrated circuit package.

Referring now to FIGS. 5A and 5B, examples of a reliability cover 500 and a reliability cover 505, respectively, are shown, in accordance with some embodiments of the present disclosure. The reliability covers 500 and 505 may be configured as a mechanical lid having a base portion 510 and ridges 515. For example, as shown in FIG. 5A, the reliability cover 500 includes the ridges 515 on all four sides of the base portion 510, while as shown in FIG. 5B, the reliability cover 505 includes the ridges on two sides of the base portion only. In other embodiments, the ridges 515 may be present on any of the sides of the base portion 510 of the reliability covers 500 and 505. Further, the ridges 515 may extend from the edges of the base portion 510, as shown in FIGS. 5A and 5B, or in other embodiments, the ridges may extend from other areas of the base portion. The height, width, and shape of the ridges 515 may also vary from one embodiment to another. Similarly, the shape and size of the reliability covers 500 and 505 may vary from one embodiment to another.

Further, in some embodiments, the reliability covers 500 and 505 may be configured to cover an entirety of a top surface of an integrated circuit package. In other embodiments, the reliability covers 500 and 505 may be configured to cover only portions of a top surface of the integrated circuit package. In yet other embodiments, the reliability covers 500 and 505 may be configured to additionally or alternatively extend to other surfaces (e.g., side surfaces) of the integrated circuit package. Generally speaking, the shape and size of the reliability covers 500 and 505, as well as the portions of the integrated circuit package that are covered by the reliability covers may depend upon the failure profile of the solder joints, as discussed further below. Furthermore, in some embodiments, the reliability covers 500 and 505 may be configured with only the base portion 510 or the ridges 515. Thus, the reliability covers 500 and 505 may be configured in a variety of ways.

Turning now to FIGS. 5C-5E, a perspective view of a device package 520 is shown, in accordance with some embodiments of the present disclosure. The device package 520 is somewhat similar to the device package 400 in that the device package 520 also includes an integrated circuit package 525 over which a reliability cover 530 has been disposed. The device package 520 also includes a PCB and a plurality of solder balls connecting the PCB to the integrated circuit package. The PCB and the plurality of solder balls are not shown in FIGS. 5A-5C. However, in contrast to the device package 400 in which the reliability cover 410 is disposed in the form of a film deposited over the integrated circuit package 405, the reliability cover 530 is disposed over the integrated circuit package 525 in the form of a mechanical lid. Thus, the reliability cover 530 is similar to the reliability covers 500 and 505 discussed above.

The reliability cover 530 may be configured in a variety of ways. For example and as shown in FIG. 5A, the reliability cover 530 may be disposed over the entirety of a top surface 535 of the integrated circuit package 525. Alternatively, the reliability cover 530 may be disposed around the perimeter of the integrated circuit package 525, as shown in FIG. 5C or disposed on selected portions of the top surface 535 of the integrated circuit package, as shown in FIG. 5B. In some embodiments, the reliability cover 530 may additionally or alternatively be disposed on side surfaces 540 and/or other portions of the integrated circuit package 525. One additional configuration of the reliability cover 530 is shown in FIG. 5G. The reliability cover 530 may be disposed over the integrated circuit package 525 on those portions where the effective CTE is desired to be increased to reduce the localized CTE mismatch value between the integrated circuit package and the PCB. Thus, the configuration in which the reliability cover 530 is disposed on the integrated circuit package 525 depends upon the failure profile of the solder joints. Other configurations are contemplated and considered within the scope of the present disclosure.

Further, the reliability cover 530, which is provided in the form of a mechanical lid, may be attached to the desired portions of the integrated circuit package 525 in a variety of ways. For example, in some embodiments, the reliability cover 530 may be attached to the integrated circuit package 525 by an adhesive. In other embodiments, the reliability cover 530 may be attached to the desired portions of the integrated circuit package 525 by other fastening mechanisms, such as nuts, screws, bolts, pins, clips, rivets, or other mechanical or non-mechanical mechanisms that are durable, reliable, and compatible with the molding material of the integrated circuit package.

The shape and size of the reliability cover 530 may also vary from one embodiment to another. As discussed above, the shape and size of the reliability cover 530 depends upon the failure profile of the solder joints. With respect to the size of the reliability cover 530, in some embodiments where the reliability cover is provided on only the corners of the integrated circuit package 525, a width and length of the reliability cover may be about one fifth (⅕) the width and length of the integrated circuit package. In some embodiments, the width and length may be about half a millimeter (0.5 mm). In other embodiments, the length and width may vary. A thickness 545 of the reliability cover 530 when formed as a mechanical lid may be a function of the height of the integrated circuit package 525 and a height of the solder balls, as well as the CTE of the integrated circuit package and the reliability cover. For example, in some embodiments, the thickness 545 of the reliability cover 530 may be calculated using the following formula:

$$5/13*(\text{height of integrated circuit package}+\text{height of one solder ball})*(\text{integrated circuit package CTE}/\text{reliability cover CTE})$$

In other embodiments, other measures or formulae may be used to determine the thickness of the reliability cover 530. The material that is used for the reliability cover 530 may have associated therewith a CTE value. The CTE value of the material used for the reliability cover 530 is known or may be determined using modeling. In some embodiments, a copper alloy, such as C89320 (Bearing Bronze) is used for the reliability cover 530. The C89320 copper alloy has a CTE of 17. In other embodiments, an aluminum alloy, nickel, cupronickel, other type of nickel alloy, stainless steel, or copper-beryllium may be used. Other metals or metal alloys having a desired CTE value and that are suitable for use with the integrated circuit package 525 may be used in other embodiments. Generally speaking, the material that is selected for the reliability cover 530 is such that the combination of the CTE value for the reliability cover and the integrated circuit package on a particular region or area of the integrated circuit package matches, substantially matches, or falls within a threshold value of the CTE of the PCB.

For example, if the CTE of the PCB is fourteen and the effective CTE of a particular area on the integrated circuit package 525 is six, the CTE difference in that particular area is eight. Thus, a material may be selected for the reliability cover 530 that has a CTE value, which when combined with the effective CTE of the integrated circuit package 525 in the particular area minimizes the CTE difference of eight. Additionally, as the CTE of the material selected for the reliability cover 530 increases, the ratio of the integrated circuit package CTE and the reliability cover CTE in the formula above decreases and, thus, the overall thickness of the reliability cover 530 decreases for the same height of the integrated circuit package 525 and the same height of the solder balls. Thus, higher the CTE value of the material that is used for the reliability cover 530, smaller is the thickness 545 of the reliability cover that is needed. Example thickness values of the reliability cover 530 for a selection of materials that may be used in some embodiments is shown in the table below for a NAND package having dimensions of 12×18× 1.325 mm:

| Material of reliability cover | Dimensions of reliability cover (width × length × thickness), mm | CTE of the reliability cover, ×10⁻⁶ ppm/° C. | tensile strength, Mpa |
|---|---|---|---|
| Copper Alloy C89320 (Bearing Bronze) | 12 × 18 × 0.24 | 17 | 196 |
| Aluminum 6020-T8 | 12 × 18 × 0.17 | 23.6 | 303 |
| Cupronickel 30% | 12 × 18 × 0.25 | 16.2 | 372 |
| Stainless steel 304 | 12 × 18 × 0.24 | 17.3 | 505 |
| Copper, Beryllium 25 | 12 × 18 × 0.24 | 16.7 | 415 |
| Nickel | 12 × 18 × 0.31 | 13 | 317 |
| Stainless steel 410 | 12 × 18 × 0.41 | 9.9 | 1525 |

Therefore, the thickness 545 of the reliability cover 530 varies based upon the form size of the integrated circuit package 525, the effective CTE of the integrated circuit package, and the CTE value of the material selected for the reliability cover. In some embodiments, the thickness of the reliability cover 530 may also vary based upon the height of the solder balls.

Figure 5F:
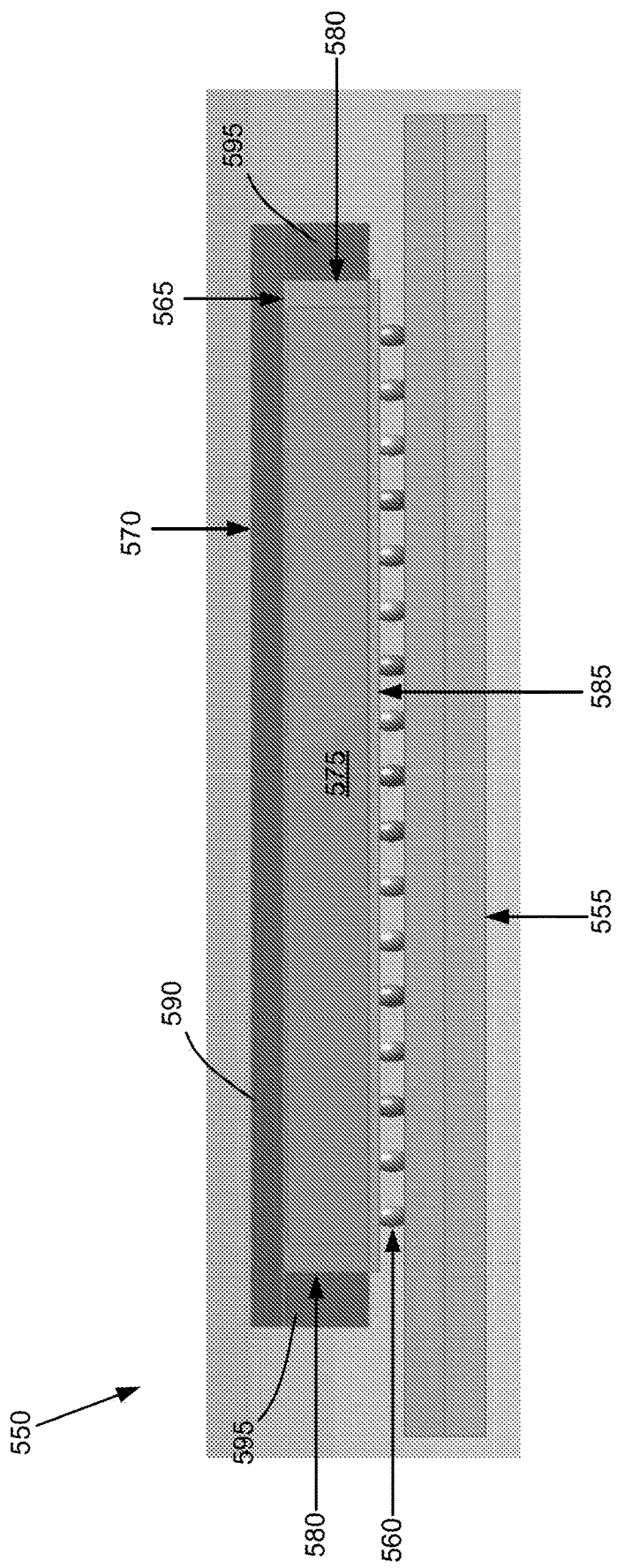
FIG. 5F is a cross-sectional view of the device package showing the reliability cover disposed thereon, in accordance with some other embodiments of the present disclosure.
Figure 5G:
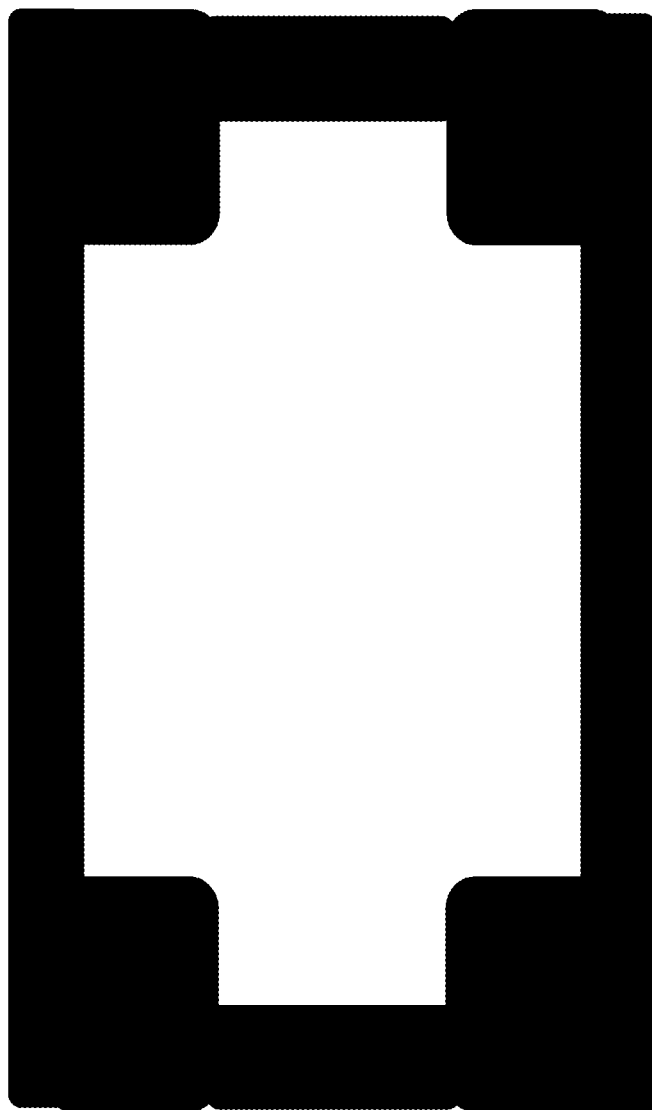
FIG. 5G shows an example configuration of the reliability cover, in accordance with some embodiments of the present disclosure.

Turning now to FIG. 5F, an example of a device package 550 is shown, in accordance with some embodiments of the present disclosure. A cross sectional view of the device package 550, as shown, includes a PCB 555, a plurality of solder balls 560, an integrated circuit package 565, and a reliability cover 570. The integrated circuit package 565 includes a Si die 575, molding material 580, and a package substrate 585. The reliability cover 570 includes a base portion 590 and ridges 595 that extend to the side surfaces of the integrated circuit package 565 and particularly to the side surfaces of the molding material 580 of the integrated circuit package. In other embodiments, the ridges 595 may be configured to not extend to the side surfaces of the integrated circuit package. Further, in some embodiments, the reliability cover 570 may be configured to cover only portions of the integrated circuit package 565, as discussed above. Thus, various configurations of the reliability cover 570 are contemplated and considered within the scope of the present disclosure.

Thus, the reliability covers 500, 505, 530, and 570 may be used to reduce a CTE mismatch between the integrated circuit package and the PCB. The reliability covers 500, 505, 530, and 570 may also be configured to serve as a thermal diffusion layer. For example, in some embodiments, the reliability covers 500, 505, 530, and 570 may be composed of materials that facilitate dissipation of heat from the integrated circuit package and the PCB. In other embodiments, the reliability covers 500, 505, 530, and 570 may be disposed on the integrated circuit package in ways that facilitate dissipation of heat from the integrated circuit package and the PCB. Furthermore, the reliability covers 500, 505, 530, and 570 increase the robustness and mechanical strength of the integrated circuit package by balancing the overall stresses on the integrated circuit package and reducing warpage. Examples of reduction in stress with the reliability cover 500, 505, 530, and 570 and without the reliability cover in some embodiments is shown in the table below:

| | Shear Stress (MPa) | | | Shear Elastic Strain | | |
|---|---|---|---|---|---|---|
| | XY Plane | YZ Plane | XZ Plane | XY Plane | YZ Plane | XZ Plane |
| Without reliability cover | 49.99 | 187.9 | 247.34 | 0.0058397 | 0.021982 | 0.028936 |
| With reliability cover 1 | 47.24 | 191.66 | 228.91 | 0.0055262 | 0.2242 | 0.02678 |
| With reliability cover 2 | 47.11 | 190.94 | 230.04 | 0.0055175 | 0.022338 | 0.026912 |
| With reliability cover 3 | 46.16 | 185 | 222.72 | 0.0054011 | 0.021647 | 0.026056 |

Thus, for the reliability covers in the table above, a reliability cover provides an overall stress reduction compared to no reliability cover, in general, of:

| XY Plane | YZ Plane | XZ Plane |
|---|---|---|
| −5% | 2% | −7% |
| −6% | 2% | −7% |
| −8% | −2% | −10% |

It is to be understood that the values in the tables above are simply an example. The values may vary based upon the configuration of the reliability cover that is used.

Figure 6B:
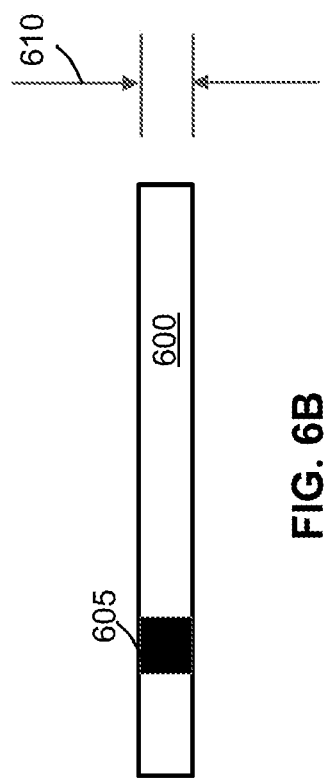
FIGS. 6A and 6B are top and side views respectively, of the reliability cover, in accordance with yet other embodiments of the present disclosure.
Figure 6A:
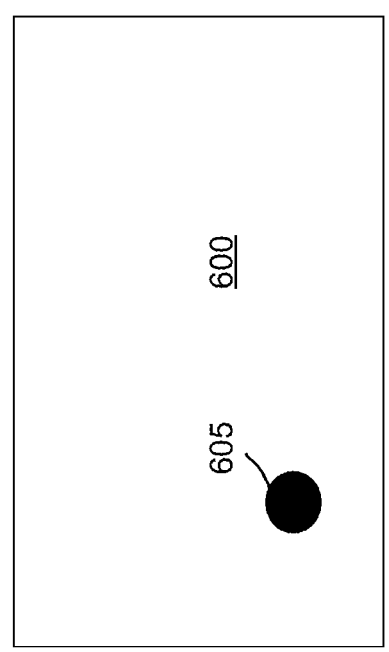

Turning now to FIGS. 6A and 6B, another example of a reliability cover 600 is shown, in accordance with some embodiments of the present disclosure. The reliability cover 600 is somewhat similar to the reliability cover 500. FIG. 6A shows a top view of a base portion of the reliability cover 600, while FIG. 6B shows a side view of the base portion of the reliability cover. The reliability cover 600 is configured to cover the top surface of the integrated circuit package (e.g., the integrated circuit package 525) in its entirety. The dimensions of the reliability cover 600, therefore, correspond to the dimensions of the top surface of the integrated circuit package over which the reliability cover is disposed. For example, the reliability cover 600 that covers an entire top surface of the 12×18 type of integrated circuit package having a top surface dimension of eighteen millimeters by twelve millimeters (18 mm×12 mm) may also have a dimension of about eighteen millimeters by about twelve millimeters (18 mm×12 mm), as shown in FIG. 6A. In other embodiments, the dimensions of the reliability cover 600 may vary somewhat from the dimensions of the integrated circuit package.

Further, in some embodiments, the reliability cover 600 may include an air release hole 605. The air release hole 605 may extend through a thickness 610 of the reliability cover 600. The purpose of the air release hole 605 is to vent any air pressure from between the reliability cover and the integrated circuit package to provide a snug and reliable fit of the reliability cover 600 over the integrated circuit package particularly when an adhesive is used to attach the reliability cover to the integrated circuit package. Thus, the air release hole 605 allows for outgassing to prevent pressure build up between the integrated circuit package and the reliability cover 600. The size and positioning of the air release hole 605 over the reliability cover 600 may vary from one embodiment to another. For example, in some embodiments, the air release hole 605 may be about one millimeter (~1 mm) in diameter. In other embodiments, other diameters for the air release hole 605 may be used.

Likewise, the positioning of the air release hole 605 on the reliability cover 600 may vary from one embodiment to another. Also, when the reliability cover 600 is provided on only portions of the integrated circuit package, in some embodiments, an air release hole for each distinct portion may be provided.

Referring now to FIG. 7, an example process flow 700 of attaching a reliability cover that is provided in the form of a lid (e.g., the reliability cover 500, 505, 530, and 600) to an integrated circuit package (e.g., the integrated circuit package 525) is shown, in accordance with some embodiments of the present disclosure. FIG. 7 shows a solder ball 705 attached to an integrated circuit package 710 over which a reliability cover 715 is to be disposed. As noted above, the reliability cover 715 is disposed over a molding material of the integrated circuit package 710.

To attach the reliability cover 715 to the integrated circuit package 710, a layer of adhesive 720 is deposited over those portions of the integrated circuit package where the reliability cover 715 is desired, as shown at operation 725. The reliability cover 715 is positioned over the adhesive 720, as shown at operation 730. The adhesive 720 is cured at operation 735 to firmly and permanently attach the reliability cover 715 to the integrated circuit package 710. When the reliability cover 715 is provided in the form of a thin film, as described above in FIGS. 4A-4C, instead of depositing a layer of the adhesive 720 at the operation 725, the thin film for the reliability cover may be deposited directly over the integrated circuit package 710 via any of a variety of film depositing techniques such as sputtering. In some embodiments, adhesion films such as TiN, Ta, TaN, etc. may be used to attach the thin film to the surface of the integrated circuit package 710.

The integrated circuit package 710 may be attached to PCB 740 and particularly to substrate pad 745 of the PCB at operation 750. Specifically, the solder ball 705 may be attached to the substrate pad 745 on the PCB 740 via a solder paste 755 and cured using reflow techniques that melt the solder paste and attach the PCB to the integrated circuit package 710. It is to be understood that in some embodiments, the PCB 740 may be attached to the solder ball 705 before the reliability cover 715 is attached to the integrated circuit package 710 or, in some embodiments and as shown in FIG. 7, the PCB may be attached after the reliability cover is attached to the integrated circuit package.

Figure 8:
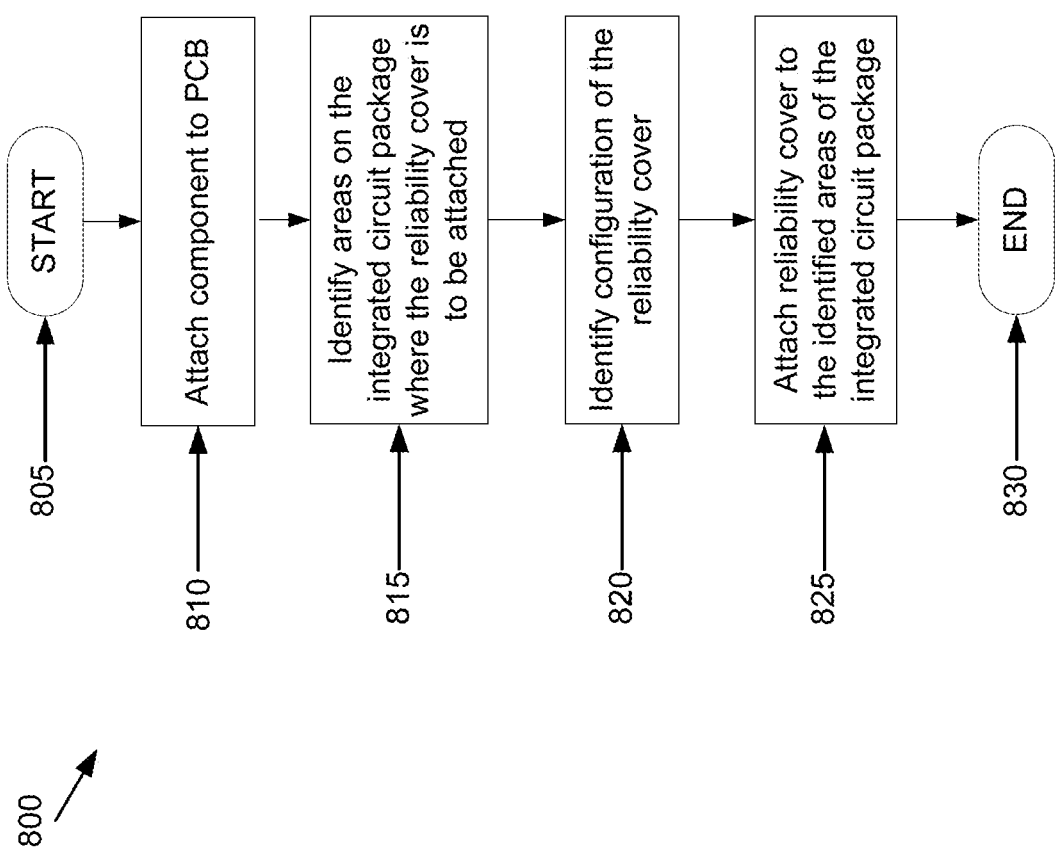
FIG. 8 is an example flowchart outlining operations for disposing the reliability cover over the integrated circuit package, in accordance with some embodiments of the present disclosure.

Turning to FIG. 8, a flow chart outlining a process 800 for disposing a reliability cover over an integrated circuit package is shown, in accordance with some embodiments of the present disclosure. Additional, fewer, or different operations may be performed in the process 800 depending on the embodiment. After starting at operation 805, the PCB may be attached to the integrated circuit package at operation 810. As discussed above, the PCB may be attached to the integrated circuit package either before disposing the reliability cover or after. If the PCB is attached to the integrated circuit package after disposing the reliability cover, the operation 810 may be performed later.

At operation 815, areas of the integrated circuit package are identified where the reliability cover is needed. In some embodiments, the areas to dispose the reliability cover on the integrated circuit package are identified from simulations, such as finite element analysis that simulate actual field use conditions. From the simulations, the failure profile of the solder joints for the integrated circuit package and the PCB may be identified. The failure profile of the solder joints may vary based upon the type and size of the integrated circuit package. As discussed above, the failure profile may provide an indication of which solder joints are more prone to failing (e.g., cracking).

The failure profile may also identify the localized CTE mismatch values over various portions of the integrated circuit package. For example, the failure profile may identify those areas of the integrated circuit package whose CTE difference with the CTE of the PCB is the greatest (or the difference is over a particular threshold). The solder joints corresponding to areas of the integrated circuit package with the greatest CTE difference or with the CTE difference over a particular threshold are likely to fail before the solder joints corresponding to those areas of the integrated circuit package where the CTE mismatch is lower. Therefore, identifying localized CTE mismatches at various portions of the integrated circuit package provides a more accurate mismatch profile of the integrated circuit package. In other embodiments, the CTE mismatch may be substantially uniform (e.g., substantially same or similar) across the various portions of the integrated circuit package.

By identifying the localized CTE mismatches, a determination may be made as to the form, size, shape, and material of the reliability cover that is to be disposed over the integrated circuit package at operation 820. Specifically, the CTE difference between the integrated circuit package and the PCB is determined. Based upon the CTE difference, a threshold value may be identified. The threshold value may be same, similar, or different from the CTE difference. For example, in some embodiments, it may be desired to have the CTE difference between the PCB and the integrated circuit package be as lowest as practically possible. In other embodiments, a CTE difference between the PCB and the integrated circuit package may be desired to be below a certain targeted CTE value. Thus, the threshold value may be identified at the operation 820. Based upon the threshold value, the form (e.g., film, mechanical lid, or both), location, size, shape, and material of the reliability cover are identified at the operation 820.

At operation 825, the reliability cover is disposed over the portions of the integrated circuit package identified at the operation 815 using the configuration identified at the operation 820. As discussed above, the manner of disposing the reliability cover on the integrated circuit package depends upon the form in which the reliability cover is disposed. If the reliability cover is disposed in the form of a film, film deposition techniques may be used. If the reliability cover is disposed in the form of a mechanical lid, an adhesive or a fastening mechanism may be used. Where portions of the reliability cover are disposed in the form of a film and other portions in the form of a mechanical lid, both film deposition and adhesives may be used. The process 800 ends at operation 830.

Thus, the reliability cover provides a mechanism to minimize CTE mismatches between the PCB and the integrated circuit package. By minimizing the CTE mismatches, the shear stresses may be reduced and the solder joint cracks may be minimized or at least the propagation of those cracks reduced. Further, although the reliability cover has been described with respect to disposing on a surface of the integrated circuit package, in some embodiments, the reliability cover may additionally or alternatively be disposed on a surface of the Si dies within the integrated circuit package. For example and as discussed further below, in some embodiments, a reliability cover in the form of a thin film may be disposed on a surface of the Si dies and a reliability cover in the form of a mechanical lid may be disposed on a surface of the integrated circuit package. Thus, both film and mechanical lid types of reliability covers may be used simultaneously. In some embodiments, certain portions of surfaces of the Si dies and/or the integrated circuit package may have a reliability cover configured as a mechanical lid and other portions of the Si dies and/or the integrated circuit package may have a reliability cover configured as a thin film. Thus, a single surface of the Si dies and/or the integrated circuit package may include both types of reliability covers in some embodiments.

In addition to or instead of providing the reliability cover of one or both types, in some embodiments, the robustness of the solder joint may be further increased by increasing the volume of the solder ball. In some embodiments, the volume of the solder ball may be increased by increasing a height (also referred to as standoff height) of the solder ball. In some embodiments, the increased volume solder balls may be used in combination with the reliability cover discussed above. FIGS. 9A-13 discuss systems and methods for increasing the volume of the solder ball.

Turning to FIGS. 9A and 9B, examples of solder preforms 900 and 905, respectively, are shown, in accordance with some embodiments of the present disclosure. The solder preforms 900 and 905 may be used to increase the volume of a solder ball. Specifically, the solder preforms 900 and 905 may be configured to be attached to a PCB and additionally receive and permanently connect to a solder ball. Thus, the solder ball is connected to the PCB via the solder preforms 900 or 905. In some embodiments, the solder preforms 900 and 905 may be composed of a combination of SAC405, 3% Bi and 0.05% Ni. In other embodiments, other compositions that are reliable and durable may be used for the solder preforms 900 and 905. The shape and size of the solder preforms 900 and 905 may vary depending upon the increase in volume of the solder ball that is desired and the manner of attaching the solder ball to the PCB.

For example, when the solder ball is attached to the PCB via a recess formed in the PCB, the solder preform 900 may be used. As shown in FIG. 9A, the solder preform 900 is shaped like a circular disk to fit within a recess on the PCB. In some embodiments, the shape of the solder preform 900 may be configured to match or substantially match the shape of the recess on the PCB within which the preform is configured to be fitted. For example, in such embodiments, for a circular recess on the PCB, the solder preform 900 may be substantially circular as well, as shown in FIG. 9A. For a square shaped recess on the PCB, the solder preform 900 may be substantially square as well. In other embodiments, the shape of the solder preform 900 may be different from the shape of the recess on the PCB.

Similarly, the size of the solder preform 900 may vary from one embodiment to another. For example, in some embodiments, the solder preform 900 may be designed such that a thickness 910 of the solder preform matches or substantially matches a thickness (e.g., height) of the recess on the PCB. In other embodiments, the thickness 910 of the solder preform 900 may be less than or greater than the thickness of the PCB. Further, the thickness 910 of the solder preform 900 may be determined by the volume (e.g., standoff height) of the solder ball that is desired. Thus, the thickness 910 of the solder preform 900 may be determined by the size of the recess and the desired increase in volume of the solder ball.

A width 915 of the solder preform 900 may similarly be determined based upon the size of the recess on the PCB. Since the solder preform 900 is configured to fit within the recess on the PCB, the width 915 of the solder preform may be substantially equal to or less than a width of the recess on the PCB. In some embodiments, the width 915 of the solder preform 900 may be determined based upon a size of the solder ball and/or the desired volume increase in the solder ball. As an example, in some embodiments, the thickness 910 of the solder preform 900 may be about one hundred and thirty micrometers (~100-130 μm) and the width 915 may be about four hundred micrometers (~400 μm). In other embodiments, other thicknesses and widths may be used for the solder preform 900.

Further, in some embodiments and as shown, the solder preform 900 is configured to have a substantially flat (e.g., not curved) profile. In other embodiments, the solder preform 900 may have a curved surface similar to the solder preform 905 of FIG. 9B.

The solder preform 905 is somewhat similar to the solder preform 900. For example, the solder preform 905 may be composed of similar materials as the solder preform 900. In contrast to the solder preform 900 which is configured to fit within a recess on the PCB, the solder preform 905 is configured to sit on a top surface of the PCB. The solder preform 905 is configured with a curved surface as shown in FIG. 9B to receive and securely attach to a solder ball. The curvature of the solder preform 905 may substantially follow or be slightly larger than the curvature of the solder ball. In some embodiments, a thickness 920 and a width 925 of the solder preform 905 may be similar to the thickness 910 and width 915 of the solder preform 900. In other embodiments, the thickness 920 and the width 925 of the solder preform 905 may vary. Example materials and dimensions of the solder preform 900 and the solder preform 905 that may be used in some embodiments are shown in the table below:

sition, etc. to create the recess 1010. Generally speaking, any fabricating technique that is suitable for creating recesses in a PCB structure may be used to create the recess 1010.

Further, in some embodiments, the recess 1010 is created such that it extends only partially through the body of the substrate 1015. In other words, the recess 1010 is not a through-hole or does not extend all the way from the top to the bottom surface of the substrate. In some embodiments, a recess such as the recess 1010 may be created on the top surface of the substrate 1015 and another recess may be created on the bottom surface of the substrate in such a way that the two recesses do not meet. Within the recess 1010, a solder preform 1025 may be fitted, as shown at operation 1030. The solder preform 1025 is similar to the solder preform 900. The solder preform 1025 may be fitted within the recess 1010 in any of a variety of ways including, for example, friction fit, adhesives, etc. Further, the material with which the solder preform 1025 is composed of may be the same, similar, or different from the material with which the solder ball 1005 is created from.

Over the solder preform 1025, a flux layer 1035 is deposited, as shown at operation 1040. The flux layer 1035 serves as a cleaning and protecting agent and removes any impurities and dirt from the surface of the solder preform 1025 before attaching the solder ball 1005. At operation 1045, the solder ball 1005 is positioned over the flux layer 1035 and at operation 1050, the reflow or other mechanism is used to permanently attach the solder ball 1005 to the solder preform 1025. By virtue of attaching the solder ball 1005 to the solder preform 1025, the height of the solder ball may be increased. For example, if the height of the solder ball 1005 before being attached to the solder preform 1025 is "H1," as shown at the operation 1045 and after being attached to the preform is "H2," as shown at the operation 1050, the height "H2" is the total height of the solder ball plus the solder preform. Thus, the height "H2" is greater

| Type of integrated circuit package | Size of integrated circuit package | Material of the preform | Dimensions of the preform (Diameter × thickness), mm | Volume of the preform, mm$^3$ |
| --- | --- | --- | --- | --- |
| 1Z NAND | 12 × 18 × 1.325 | SAC305 | 0.4 × 0.13 | 0.0163 |
| DDR 2G Nanya | 8 × 10.5 × 1 | SAC405-3%Bi—0.05%Ni | 0.3 × 0.10 | 0.0071 |
| DDR 2G Nanya | 12 × 18 × 1.325 | Sn3.2Ag0.7Cu5.5Sb | 0.4 × 0.13 | 0.0163 |

Figure 10:
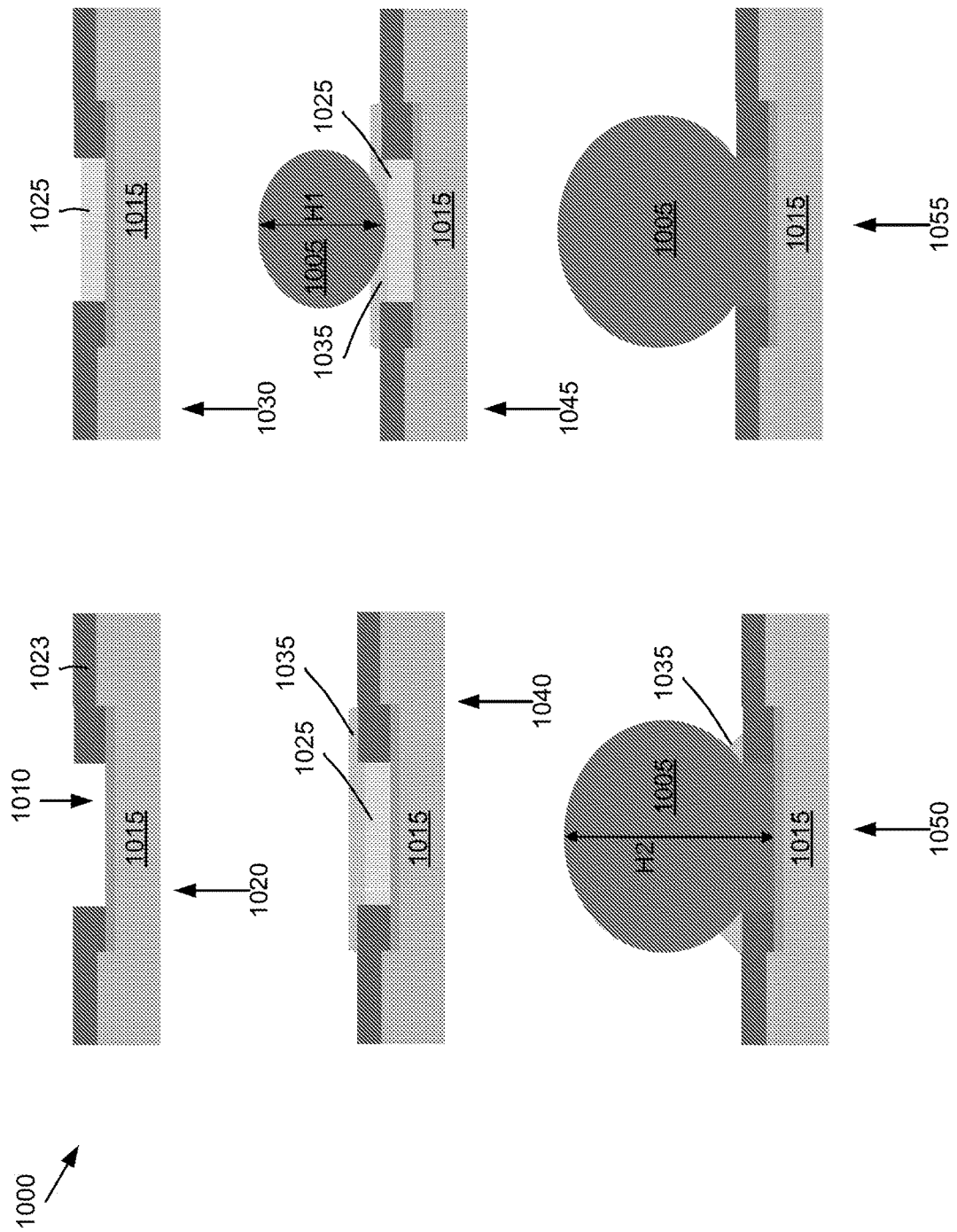
FIG. 10 is an example flow diagram showing a process for attaching the solder balls to the printed circuit board, in accordance with some embodiments of the present disclosure.

Turning now to FIG. 10, an example of a flow diagram showing a process 1000 for using the solder preform 900 to increase the volume of a solder ball 1005 is shown, in accordance with some embodiments of the present disclosure. A recess 1010 is created on a substrate 1015, as shown at operation 1020. In those embodiments where the solder ball 1005 is between the integrated circuit package and a PCB, the substrate 1015 is representative of the PCB. In those embodiments in which the solder ball 1005 is between a Si die and the integrated circuit package, the substrate 1015 may be representative of a substrate of the integrated circuit package. The size of the solder ball 1005 and the desired increase in the volume of the solder ball may also vary depending upon the pitch size between solder balls and the substrate 1015 diameter.

In some embodiments, the recess 1010 may be created by depositing a substrate pad on a surface of the substrate 1015 and using any of a variety of semiconductor fabricating techniques, such as photolithography, chemical vapor depothan the height "H1." Upon attaching the solder ball 1005 to the solder preform 1025, at operation 1055 the flux layer 1035 is removed.

By virtue of increasing the height of the solder ball 1005, the volume of the solder ball may be increased. By increasing the volume of the solder ball 1005, the robustness of the solder ball may be increased and the reliability of the solder joint formed by that solder ball may be improved. Increasing the volume of the solder ball 1005 using the solder preform 1025 is particularly advantageous because smaller solder balls may be used, which are cheaper than using bigger solder balls. Further, more number of solder balls may be used on the PCB. Generally speaking, a higher number of solder balls are desired to be used on the PCB. Thus, by using the solder preform 1025 to increase the volume of the solder ball, no re-design of existing solder balls is needed.

Figure 11:
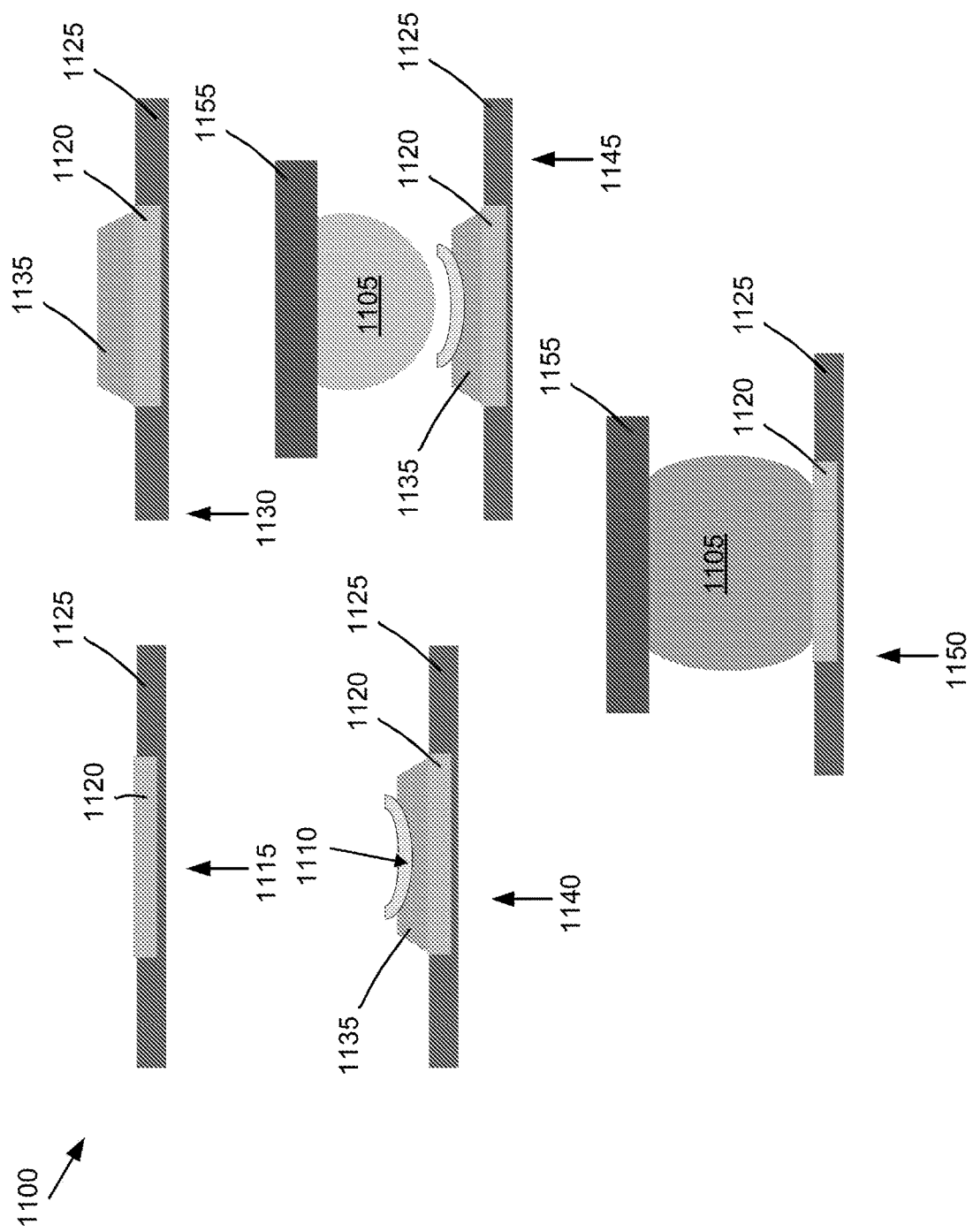
FIG. 11 is another example flow diagram showing a process for attaching the solder balls to the printed circuit board, in accordance with some other embodiments of the present disclosure.

Turning to FIG. 11, another flow diagram showing a process 1100 for increasing the volume of a solder ball 1105 is shown, in accordance with some embodiments of the present disclosure. The process 1100 uses a solder preform 1110 to increase the volume of the solder ball 1105. The solder preform 1110 is similar to the solder preform 905 of FIG. 9B having a curved surface to accommodate the solder ball 1105. Specifically, at operation 1115, a substrate pad 1120 is formed on a top surface of a substrate 1125. The substrate 1125 is representative of a portion of a PCB or a portion of the integrated circuit package substrate, as discussed above with respect to FIG. 10. The size and shape of the substrate pad 1120 may vary based upon the size and shape of the solder ball 1105.

At operation 1130, solder paste 1135 is deposited over at least a portion of the substrate pad 1120. Over the solder paste 1135, the solder preform 1110 is disposed at operation 1140 to attach the solder preform to the substrate pad 1120. The solder ball 1105 is positioned over the solder preform 1110 at operation 1145 and at operation 1150 and a reflow or other mechanism is used to permanently attach the solder ball to the solder preform. The height of the solder ball increases after being attached to the solder preform 1110, similar to what is described in FIG. 10 above.

It is to be understood that the integrated circuit package (e.g., integrated circuit package 1155) may be attached to the solder balls (e.g., the solder ball 1105) either before or after connecting the solder balls to the solder preform 1110. Further, in some embodiments, a combination of the solder preforms 1025 and 1110 may be used. In such embodiments, a portion of the solder balls may be connected to the PCB using the solder preform 1025, while another portion of the solder balls may be connected to the PCB using the solder preform 1110. Further, based upon the height that is desired, different solder balls may also have different heights. For example, since the solder joints at corner and edges are more prone to failing, it may be desired to increase the height of the solder balls that are towards the edges or corners to increase the solder joint reliability in those areas compared to the solder balls that are towards a center.

Referring now to FIG. 12, a flowchart outlining a process 1200 for increasing the volume of a solder ball using the solder preform 900 and 1025 is shown, in accordance with some embodiments of the present disclosure. Additional, fewer, or different operations may be performed in the process 1200 depending on the embodiment. After starting at operation 1205, a recess is formed on a surface of the PCB at operation 1210. The operation 1210 corresponds to the operation 1020 of FIG. 10 above. Within the recess, a solder preform (e.g., the solder preforms 900, 1025) is deposited at operation 1215. The operation 1215 is analogous to the operation 1030. The solder balls are attached to the deposited solder preform at operation 1220, which is analogous to the operations 1040 and 1045 of FIG. 10 above. The solder preform and the solder balls are joined together at operation 1225 using reflow or other techniques. The operation 1225 is analogous to the operations 1050 and 1055. The process 1200 ends at operation 1230.

Turning to FIG. 13, another flowchart outlining a process 1300 for increasing the volume of a solder ball using the solder preforms 905 and 1110 is shown, in accordance with some embodiments of the present disclosure. Additional, fewer, or different operations may be performed in the process 1300 depending on the embodiment. After starting at operation 1305, a substrate pad is formed on a surface of the PCB and solder paste is deposited over the substrate pad at operation 1310. The operation 1310 is analogous to the operations 1115 and 1130. At operation 1315, a solder preform (e.g., the solder preforms 905, 1110) is deposited over the solder paste, as shown at the operation 1140 of FIG. 11. At operation 1320, the solder balls are attached to the solder preform and at operation 1325, the solder balls are joined to the solder preform using reflow or other techniques. The operations 1320 and 1325 are analogous to the operations 1145 and 1150 of FIG. 11. The process 1300 ends at operation 1330.

Figure 14:
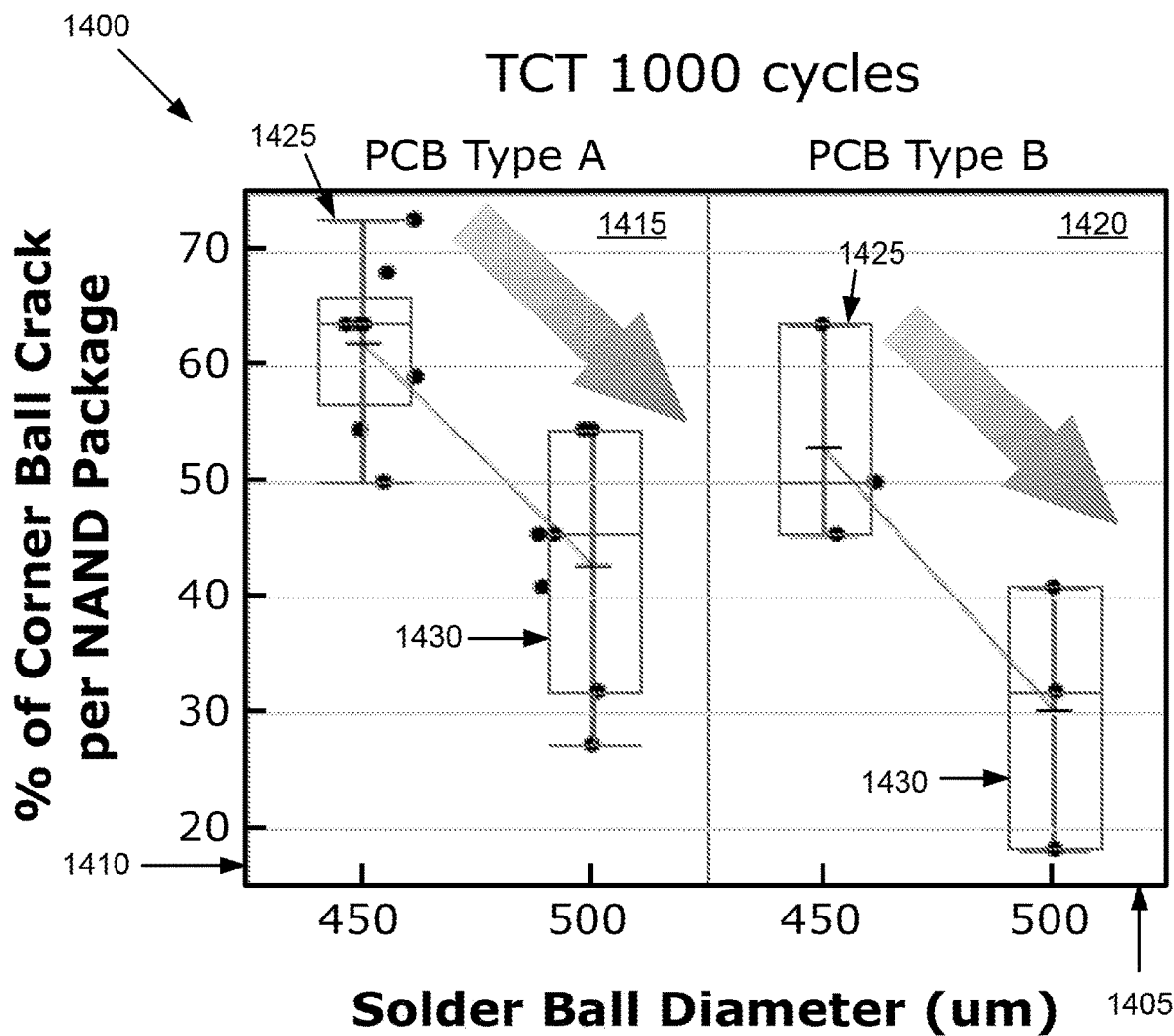
FIG. 14 is a graph illustrating variations in the solder joint reliability for a first height and a second height of the solder balls.

Referring now to FIG. 14, an example graph 1400 is shown, in accordance with some embodiments of the present disclosure. The graph 1400 illustrates how the increase in volume of the solder balls impacts the reliability of the solder joints. The graph 1400 plots a height of the solder balls along X-axis 1405 and a number of cracks or failures in the solder joints on Y-axis 1410. The graph 1400 compares solder joints composed of solder balls having an effective standoff height of four hundred and fifty micrometers with solder joints composed of solder balls having an effective standoff height of five hundred micrometers, as shown on the X-axis 1405. Further, the graph 1400 provides results for two different types of PCB: a single type of PCB and a trifold type of PCB, as shown along row 1415. Other conditions, such as die capacity, reflow profile, and number and temperature of TCT cycles is the same for both solder balls, as shown along rows 1420, 1425, and 1430 of the graph 1400.

For each PCB type, the graph 1400 provides a first plot 1435 representative of the solder balls with the standoff height of four hundred and fifty micrometers and a second plot 1440 representative of the solder balls with the standoff height of five hundred micrometers. Comparing the first plot 1435 with the second plot 1440 for each PCB type, it is seen that the second plot has fewer number of cracks or failures on the Y-axis 1410. The graph 1400 shows a reduction of approximately twenty percent from the solder balls represented by the first plot 1435 to the solder balls represented by the second plot 1440.

Thus, the graph 1400 illustrates that increasing the volume or standoff height of the solder balls reduces the number of cracks or failures at the solder joints, thereby increasing the reliability of those solder joints.

Figure 15:
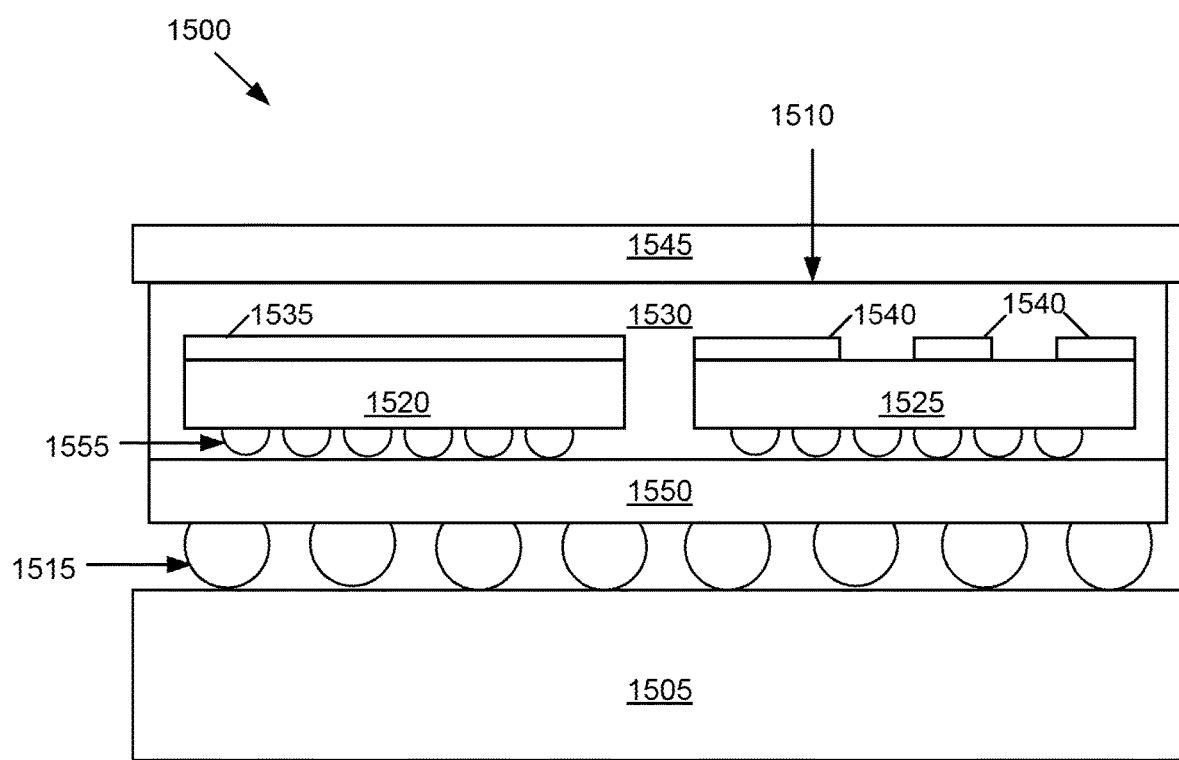
FIG. 15 is a cross sectional view of an example device package having first and second levels of reliability covers, in accordance with some embodiments of the present disclosure.

Referring now to FIG. 15, a cross sectional view of a device package 1500 is shown, in accordance with some embodiments of the present disclosure. The device package 1500 includes a PCB 1505 over which an integrated circuit package 1510 is connected via a first plurality of solder balls 1515. The integrated circuit package 1510 in turn includes a first Si die 1520, a second Si die 1525, and molding material 1530 surrounding the first Si die and the second Si die. A first reliability cover 1535 is disposed over the first Si die 1520, a second reliability cover 1540 is disposed over the second Si die 1525, and a third reliability cover 1545 is disposed over the molding material 1530 of the integrated circuit package 1510. Each of the first Si die 1520 and the second Si die 1525 is connected to a substrate 1550 of the integrated circuit package 1510 via a second plurality of solder balls 1555.

The second plurality of solder balls 1555 may be considered a first level of interconnects and the first plurality of solder balls 1515 may be considered a second level of interconnects. In some embodiments, the size of the second plurality of solder balls 1555 may be smaller than the size of the first plurality of solder balls 1515. Further, in some embodiments, the first plurality of solder balls 1515 may be arranged in the ball-grid array configuration discussed above, while the second plurality of solder balls 1555 may be arranged in a flip chip configuration. Other configurations and arrangements of the first plurality of solder balls 1515 and the second plurality of solder balls 1555 are contemplated and considered within the scope of the present disclosure. In some embodiments, interconnects other than solder balls may be used for the first level of interconnects and the second level of interconnects.

Furthermore, the first reliability cover 1535, the second reliability cover 1540, and the third reliability cover 1545 may be configured in a variety of ways. For example, in some embodiments and as shown in FIG. 15, the first reliability cover 1535 and the second reliability cover 1540 may be configured as a thin film, while the third reliability cover 1545 may be configured as a mechanical lid. Since the first reliability cover 1535 and the second reliability cover 1540 are disposed on the first Si die 1520 and the second Si die 1525, respectively, the first and second reliability covers may be called a die-level reliability cover. Since the third reliability cover 1545 is disposed on the integrated circuit package 1510, the third reliability cover may be called a package level reliability cover.

Although the first reliability cover 1535 and the second reliability cover 1540 have been described as being configured as a thin film, in other embodiments, either or both of the first and second reliability covers, or at least portions thereof, may be configured as a mechanical lid. Similarly, although the third reliability cover 1545 has been described as being configured as a mechanical lid, in other embodiments, the third reliability cover or at least portions thereof may be configured as a thin film.

Further, the shape, size, and material of each of the first reliability cover 1535, the second reliability cover 1540, and the third reliability cover 1545 may vary from one embodiment to another. For example, as shown with respect to the first reliability cover 1535 and the third reliability cover 1545, the reliability covers may be disposed on the entirety of the top surface of the first Si die 1520, the second Si die 1525, and the integrated circuit package 1510. In other embodiments and as shown with respect to the second reliability cover 1540, the reliability covers may be disposed on certain portions of the first Si die 1520, the second Si die 1525, and the integrated circuit package 1510. Again, the configuration of the first reliability cover 1535, the second reliability cover 1540, and the third reliability cover 1545 and the portions of the first Si die 1520, the second Si die 1525, and the integrated circuit package 1510 on which those reliability covers are disposed may vary based upon the failure profile of the solder joints. Thus, the configuration of the first reliability cover 1535 and the second reliability cover 1540 and the portions of the first Si die 1520 and the second Si die 1525, respectively, may vary based upon the failure profile of the second plurality of solder balls 1555. Similarly, the configuration of the third reliability cover 1545 and the portions of the integrated circuit package 1510 that the reliability cover is disposed on may vary based upon the failure profile of the solder joints of the first plurality of solder balls 1515.

It is to be understood that the disclosure with respect to the package level reliability covers as discussed above is also applicable to the die-level reliability covers. By virtue of using multiple levels of reliability covers, greater degrees of robustness, stress reduction, and thermal dissipation may be achieved. Further, although the integrated circuit package 1510 has been shown as having two Si dies (e.g., the first Si die 1520 and the second Si die 1525), in other embodiments, greater than or fewer than two Si dies may be present within the integrated circuit package, and one or more of those Si dies may be configured with reliability covers. Additionally, in some embodiments, either the die level reliability covers or the package level reliability covers may be used. Thus, various configurations of the die level reliability covers and package level reliability covers are contemplated and considered within the scope of the present disclosure.

Figure 16:
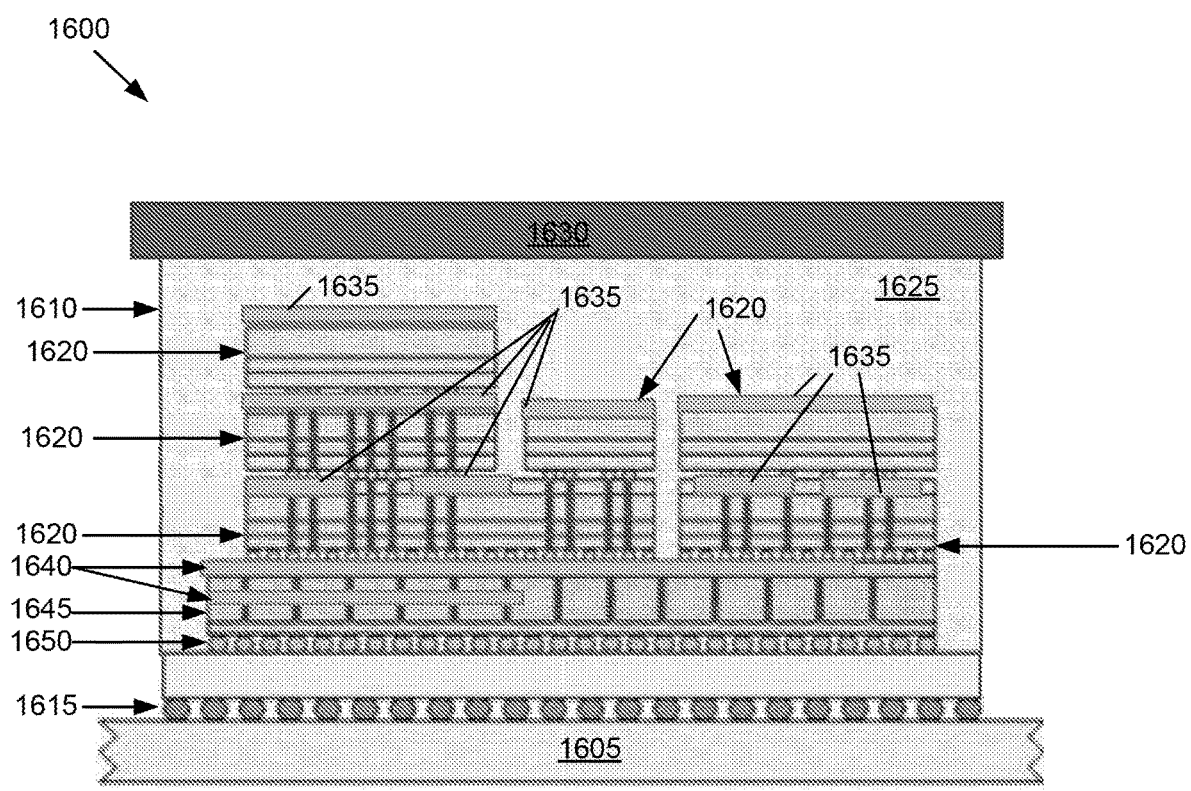
FIG. 16 is a cross sectional view of an example device package having multiple levels of reliability covers, in accordance with some other embodiments of the present disclosure.

Turning now to FIG. 16, a cross sectional view of a device package 1600 is shown, in accordance with some embodiments of the present disclosure. The device package 1600 includes a PCB substrate 1605 attached to an integrated circuit package 1610 via a first plurality of solder balls 1615. The integrated circuit package 1610 includes a plurality of Si dies 1620 arranged in a stacked configuration and encapsulated within a molding compound 1625. The number and stacking configuration of the plurality of Si dies 1620 within the integrated circuit package 1610 may vary from one embodiment to another. The device package 1600 also includes a plurality of reliability covers, including a first reliability cover 1630, a plurality of second reliability covers 1635, and one or more third reliability covers 1640.

The first reliability cover 1630 may be a package level reliability cover that is disposed on a surface of the integrated circuit package 1610 and particularly over a surface of the molding compound 1625 of the integrated circuit package. In some embodiments and as shown in FIG. 16, the first reliability cover 1630 may be configured as a mechanical lid, although in some embodiments, the first reliability cover may be configured as a thin film as well. The shape, size, and material of the first reliability cover 1630 may vary based upon the failure profile of the first plurality of solder balls 1615. Likewise, the portions of the integrated circuit package 1610 on which the first reliability cover 1630 is disposed upon may vary from one embodiment to another based upon the failure profile of the first plurality of solder balls 1615, as well as the stress reduction achieved by the plurality of second reliability covers 1635 and the one or more third reliability covers 1640.

The plurality of second reliability covers 1635 and the one or more third reliability covers 1640 are both die level reliability covers. In some embodiments, either or both of the plurality of second reliability covers 1635 and the one or more third reliability covers 1640 may be configured as a thin film. The shape, size, and material of the plurality of second reliability covers 1635 and the one or more third reliability covers 1640, as well the portions of the surface on which the plurality of second reliability covers and the one or more third reliability covers are disposed upon may vary from one embodiment to another as well.

The plurality of second reliability covers 1635 may be disposed upon the surfaces of the plurality of Si dies 1620, and the one or more third reliability covers 1640 may be disposed on and/or within a interposer layer 1645 that may be interposed between a second plurality of solder balls 1650 and the plurality of Si dies 1620. The one or more third reliability covers 1640 may be provided in one or more layers of the interposer layer 1645. For example, as shown in FIG. 16, the one or more third reliability covers 1640 may be provided on a top surface of the interposer layer, as well as incorporated within the interposer layer. When incorporated within the interposer layer 1645, the one or more third reliability covers 1640 may be provided as part of the fabrication step of the interposer layer.

The following description is directed to certain implementations for the purposes of describing the innovative aspects of this disclosure. However, a person having ordinary skill in the art will readily recognize that the teachings herein can be applied in a multitude of different ways.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A system, comprising:
   an integrated circuit package, wherein the integrated circuit package comprises at least a circuit die;
   a first reliability cover disposed over at least a portion of a top surface of the circuit die; and
   a second reliability cover disposed over at least a portion of a top surface of the first reliability cover,
   wherein the first reliability cover does not cover a side area of the circuit die,
   wherein the side area of the circuit die does not include any top surface of the circuit die,
   wherein the first reliability cover is not in direct contact with the second reliability cover,
   wherein the integrated circuit package is directly or indirectly mountable to a circuit board,
   wherein a coefficient of thermal expansion of the first reliability cover is greater than a coefficient of thermal expansion of the circuit board, and
   wherein the coefficient of thermal expansion of the circuit board is greater than a coefficient of thermal expansion of the integrated circuit package.

2. The system of claim 1, wherein the first reliability cover is composed of at least one of a copper alloy and an aluminum alloy.

3. The system of claim 1, wherein the second reliability cover does not cover the side area of the circuit die.

4. The system of claim 1, wherein the second reliability cover does not cover a side area of the integrated circuit package, and
   wherein the side area of the integrated circuit package does not include any top surface of the integrated circuit package.

5. The system of claim 1, wherein the first reliability cover does not cover at least another portion of the top surface of the circuit die.

6. The system of claim 1,
   wherein the second reliability cover does not cover any part of all side areas of the integrated circuit package, and
   wherein none of the all side areas of the integrated circuit package includes any portion of the top surface of the integrated circuit package.

7. The system of claim 1,
wherein the integrated circuit package is directly or indirectly mounted to the circuit board, and
wherein the system comprises solder balls between the integrated circuit package and the circuit board.

8. The system of claim 1,
wherein the integrated circuit package is directly or indirectly mounted to the circuit board, and
wherein the second reliability cover is configured to reduce a difference in a coefficient of thermal expansion between the integrated circuit package and the circuit board.

9. The system of claim 1, wherein the first reliability cover covers only one or more portions of a top surface area of the circuit die, rather than covering an entire top surface area of the circuit die.

10. The system of claim 1, wherein the second reliability cover is disposed at one or more corners of a top surface of at least one of the integrated circuit package and the circuit die.

11. The system of claim 1, wherein the first reliability cover is deposited as a film.

12. The system of claim 1, wherein the second reliability cover is configured as a mechanical lid.

13. The system of claim 1,
wherein the first reliability cover is disposed along at least a portion of a perimeter of the top surface of the circuit die, and
wherein the first reliability cover is not disposed over a center of the circuit die.

14. The system of claim 1, wherein the second reliability cover is disposed over areas of the integrated circuit package that correspond to a failure profile of solder joints formed between a plurality of solder balls and the integrated circuit package and solder joints between the plurality of solder balls and the circuit board.

15. The system of claim 1, wherein a thickness of the second reliability cover is scaled based on a height of the integrated circuit package, a coefficient of thermal expansion of the integrated circuit package, and a coefficient of thermal expansion of the first reliability cover.

16. The system of claim 1, further comprising an air release hole on a surface of the second reliability cover to vent air pressure from between the second reliability cover and the integrated circuit package.

17. The system of claim 1, wherein the top surface of the integrated circuit package has a perimeter, and the second reliability cover does not cover the perimeter.

\* \* \* \* \*